(12) United States Patent
Deng

(10) Patent No.: US 12,087,366 B2
(45) Date of Patent: Sep. 10, 2024

(54) MEMORY DEVICE AND READ OPERATION DURING SUSPENSION OF PROGRAM OPERATION THEREOF

(71) Applicant: YANGTZE MEMORY TECHNOLOGIES CO., LTD., Wuhan (CN)

(72) Inventor: Jialiang Deng, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 123 days.

(21) Appl. No.: 17/891,065

(22) Filed: Aug. 18, 2022

(65) Prior Publication Data

US 2024/0062830 A1  Feb. 22, 2024

(51) Int. Cl.
| | | |
|---|---|---|
| G11C 16/10 | (2006.01) | |
| G11C 11/56 | (2006.01) | |
| G11C 16/04 | (2006.01) | |
| G11C 16/24 | (2006.01) | |
| G11C 16/26 | (2006.01) | |

(52) U.S. Cl.
CPC .......... G11C 16/26 (2013.01); G11C 11/5628 (2013.01); G11C 11/5642 (2013.01); G11C 11/5671 (2013.01); G11C 16/0483 (2013.01); G11C 16/10 (2013.01); G11C 16/24 (2013.01); G11C 2216/20 (2013.01)

(58) Field of Classification Search
CPC . G11C 16/26; G11C 11/5628; G11C 11/5642; G11C 11/5671; G11C 16/0483; G11C 16/10; G11C 16/24; G11C 2216/20; G11C 16/32; G11C 2211/5641; G11C 2211/5642; G11C 2211/5643

See application file for complete search history.

(56) References Cited

U.S. PATENT DOCUMENTS

| | | |
|---|---|---|
| 9,601,169 B2 | 3/2017 | Hong et al. |
| 10,249,377 B2 | 4/2019 | Kasai et al. |
| 10,734,078 B2 | 8/2020 | Lee |
| 2018/0197610 A1* | 7/2018 | Lee ............... G11C 16/0483 |

FOREIGN PATENT DOCUMENTS

| | | |
|---|---|---|
| TW | 201812750 A | 4/2018 |
| WO | 2011067795 A1 | 6/2011 |

* cited by examiner

*Primary Examiner* — Xiaochun L Chen
(74) *Attorney, Agent, or Firm* — BAYES PLLC

(57) ABSTRACT

In certain aspects, a memory device includes an array of memory cells, including a first memory cell and a second memory cell, and a peripheral circuit. The peripheral circuit includes a page buffer circuit and control logic. The control logic is configured to suspend a program operation on the first memory cell responsive to receiving a suspension command, control the page buffer circuit to store suspended program information associated with a suspension of the program operation, control the page buffer circuit to release a sensing storage unit and a cache storage unit of the page buffer circuit from being occupied by the suspension of the program operation through a storage of a piece of program information from the suspended program information in a memory controller, and initiate a read operation on the second memory cell using the sensing storage unit and the cache storage unit.

20 Claims, 19 Drawing Sheets

TABLE 1

| LV | 0 | 1 | 2 | 3 | 4 | 5 | 6 | 7 |
|----|---|---|---|---|---|---|---|---|
| b1 | 1 | 0 | 1 | 0 | 0 | 1 | 0 | 1 |
| b2 | 1 | 0 | 0 | 1 | 0 | 1 | 1 | 0 |
| b3 | 1 | 0 | 0 | 0 | 1 | 0 | 1 | 1 |

FIG. 5B

TABLE 2

| TLC 5 Latch | Sensing Storage Unit (DS) | Bit Line Storage Unit (DL) | Data Storage Unit ($D_1$) | Data Storage Unit ($D_2$) | Cache Storage Unit |
|---|---|---|---|---|---|
| Stored Info/Data | INH | UP DATA | LP DATA | MP DATA | |

TABLE 3

| QLC 6 Latch | Sensing Storage Unit (DS) | Bit Line Storage Unit (DL) | Data Storage Unit ($D_1$) | Data Storage Unit ($D_2$) | Data Storage Unit ($D_3$) | Cache Storage Unit |
|---|---|---|---|---|---|---|
| Stored Info/Data | INH | XP DATA | LP DATA | MP DATA | UP DATA | |

FIG. 7A

TABLE 4

| TLC 5 Latch | Sensing Storage Unit (DS) | Bit Line Storage Unit (DL) | Data Storage Unit ($D_1$) | Data Storage Unit ($D_2$) | Cache Storage Unit |
|---|---|---|---|---|---|
| Stored Info/Data | | INH | LP DATA | MP DATA | |

TABLE 5

| QLC 6 Latch | Sensing Storage Unit (DS) | Bit Line Storage Unit (DL) | Data Storage Unit ($D_1$) | Data Storage Unit ($D_2$) | Data Storage Unit ($D_3$) | Cache Storage Unit |
|---|---|---|---|---|---|---|
| Stored Info/Data | | INH | LP DATA | MP DATA | UP DATA | |

FIG. 7B

TABLE 6

| TLC 5 Latch | Sensing Storage Unit (DS) | Bit Line Storage Unit (DL) | Data Storage Unit (D1) | Data Storage Unit (D2) | Cache Storage Unit |
|---|---|---|---|---|---|
| Stored Info/Data | | UP DATA | LP DATA | MP DATA | |

TABLE 7

| QLC 6 Latch | Sensing Storage Unit (DS) | Bit Line Storage Unit (DL) | Data Storage Unit (D1) | Data Storage Unit (D2) | Data Storage Unit (D3) | Cache Storage Unit |
|---|---|---|---|---|---|---|
| Stored Info/Data | | XP DATA | LP DATA | MP DATA | UP DATA | |

FIG. 7C

Table 8

| | Destructive Mode | Non-Destructive Mode without Controller Caching | Non-Destructive Mode with Controller Caching |
|---|---|---|---|
| Cache Resource for TLC | 3 | 0 | 1 |
| Cache Resource for QLC | 4 | 0 | 1 |
| Suspension Feature | Support | Not Support | Support |

Table 9

| Storage Unit | Sensing Storage Unit (DS) | Bias Level Storage Unit (DL) | Dynamic Storage Unit (DM) | Data Storage Unit ($D_1$) | Data Storage Unit ($D_2$) | Data Storage Unit ($D_3$) | Cache Storage Unit (DC) |
|---|---|---|---|---|---|---|---|
| Stored Info/Data | | INH | | LP DATA | MP DATA | UP DATA | XP DATA |

FIG. 12A

Table 10

| Storage Unit | Sensing Storage Unit (DS) | Bias Level Storage Unit (DL) | Dynamic Storage Unit (DM) | Data Storage Unit ($D_1$) | Data Storage Unit ($D_2$) | Data Storage Unit ($D_3$) | Cache Storage Unit (DC) |
|---|---|---|---|---|---|---|---|
| Stored Info/Data | | XP DATA / INH | INH / XP DATA | LP DATA | MP DATA | UP DATA | |

FIG. 12B

MEMORY DEVICE AND READ OPERATION DURING SUSPENSION OF PROGRAM OPERATION THEREOF

CROSS-REFERENCE TO RELATED APPLICATIONS

This application is related to U.S. application Ser. No. 17/891,068, filed on Aug. 18, 2022, entitled "MEMORY DEVICE AND READ OPERATION DURING SUSPENSION OF PROGRAM OPERATION THEREOF," and U.S. application Ser. No. 17/891,072, filed on Aug. 18, 2022, entitled "MEMORY DEVICE AND READ OPERATION DURING SUSPENSION OF PROGRAM OPERATION THEREOF," both of which are hereby incorporated by reference in their entireties.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, and a program operation or a read operation can be performed at the page level.

SUMMARY

In one aspect, a memory device includes an array of memory cells and a peripheral circuit coupled to the array of memory cells. The array of memory cells includes a first memory cell and a second memory cell. The peripheral circuit includes a page buffer and control logic. The page buffer includes at least a page buffer circuit that is coupled to the first and second memory cells, respectively. The page buffer circuit includes a sensing storage unit and a cache storage unit. The control logic is coupled to the page buffer and configured to suspend a program operation on the first memory cell responsive to receiving a suspension command indicative of executing a read operation on the second memory cell, control the page buffer circuit to store suspended program information associated with a suspension of the program operation, control the page buffer circuit to release the sensing storage unit and the cache storage unit from being occupied by the suspension of the program operation through a storage of a piece of program information from the suspended program information in a memory controller, and initiate the read operation on the second memory cell using the sensing storage unit and the cache storage unit.

In another aspect, a system includes a memory device configured to store data and a memory controller coupled to the memory device. The memory device includes an array of memory cells and a peripheral circuit coupled to the array of memory cells. The array of memory cells includes a first memory cell and a second memory cell. The peripheral circuit includes a page buffer and control logic coupled to the page buffer. The page buffer includes at least a page buffer circuit that is coupled to the first and second memory cells, respectively. The page buffer circuit includes a sensing storage unit and a cache storage uni. The control logic is configured to suspend a program operation on the first memory cell responsive to receiving a suspension command indicative of executing a read operation on the second memory cell, control the page buffer circuit to store suspended program information associated with a suspension of the program operation, and control the page buffer circuit to release the sensing storage unit and the cache storage unit from being occupied by the suspension of the program operation for the read operation on the second memory cell. The memory controller is configured to store a piece of program information from the suspended program information so that the sensing storage unit and the cache storage unit are released from being occupied by the suspension of the program operation.

In still another aspect, a method for operating a memory device including an array of memory cells is provided. The array of memory cells includes a first memory cell and a second memory cell that are coupled to a page buffer circuit in a page buffer. The page buffer circuit includes a sensing storage unit and a cache storage unit. A program operation on the first memory cell is suspended responsive to receiving a suspension command indicative of executing a read operation on the second memory cell. The page buffer circuit is controlled to store suspended program information associated with a suspension of the program operation. The page buffer circuit is controlled to release the sensing storage unit and the cache storage unit from being occupied by the suspension of the program operation through a storage of a piece of program information from the suspended program information in a memory controller. The read operation on the second memory cell is initiated using the sensing storage unit and the cache storage unit.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIG. 5B illustrates a graphical representation illustrating exemplary three bits of binary values for a piece of 3-bits data, according to some aspects of the present disclosure.

FIG. 7A is a graphical representation illustrating exemplary suspended program information stored in a page buffer circuit before an execution of a read operation, according to some aspects of the present disclosure.

FIGS. 7B-7C are graphical representations illustrating examples of a remaining portion of suspended program information stored in a page buffer circuit during an execution of a read operation, according to some aspects of the present disclosure.

FIG. 9 is a graphical representation illustrating an exemplary comparison of cache resource consumption in a memory controller between a destructive mode and a non-destructive mode, according to some aspects of the present disclosure.

FIGS. 12A and 12B are graphical representations illustrating exemplary suspended program information stored in a page buffer circuit before or during an execution of a read operation, according to some aspects of the present disclosure.

Figure 1:
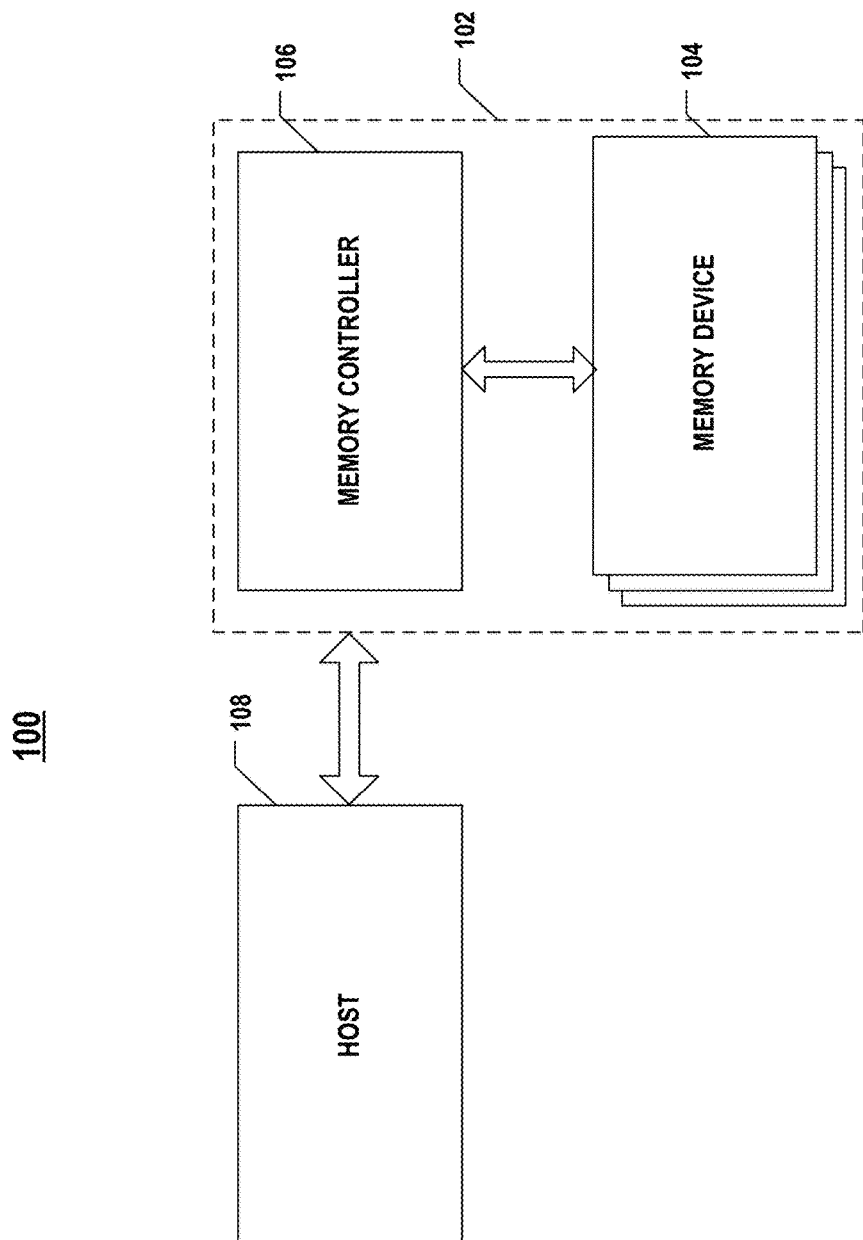
FIG. 1 illustrates a block diagram of a system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

A NAND Flash memory device can perform program (write) operations at the page/word line level, i.e., programming all the memory cells coupled to the same select word line at the same time. Since each program operation takes a relatively long time (e.g., several hundred of microseconds (μS) as it may involve multiple passes, each having multiple cycles of applying program pulses and verify pulses, the NAND Flash memory device usually supports interrupts during a program operation on one page to suspend the ongoing program operation and switch to another operation (e.g., a read operation on another page). Once the other operation is finished, the suspended program operation can be resumed to program the original page. In this case, a program-operation suspension feature can be supported by the NAND Flash memory device.

During the suspended period of the program operation (e.g., between the time when the program operation is suspended and the time when the program operation is resumed), the NAND Flash memory device may be implemented in a destructive mode or non-destructive mode. For example, if the NAND Flash memory device is implemented in the destructive mode, suspended program information associated with the suspension of the program operation is not stored in the NAND Flash memory device. In this case, in order to support the program-operation suspension feature in the NAND Flash memory device, all the suspended program information needs to be stored in a memory controller that controls the NAND Flash memory device. As a result, cache resources and bandwidth resources of the memory controller are consumed or occupied by the storage of the suspended program information in the memory controller. If the program operation suspension occurs frequently, the performance of the memory controller may be degraded with frequent storage of the suspended program information in the memory controller.

In another example, if the NAND Flash memory device is implemented in the non-destructive mode, all the suspended program information may be stored in the NAND Flash memory device. However, for a current triple-level cell (TLC) NAND Flash memory device (with 5 latches in each page buffer circuit that is coupled to a respective memory string through a bit line) or a current quad-level cell (QLC) NAND Flash memory device (with 6 latches in each page buffer circuit that is coupled to a respective memory string through a bit line), it is difficult to support the program-operation suspension feature in the memory device under the non-destructive mode due to the limited number of latches included in each page buffer circuit.

Specifically, if the program operation is interrupted by a read operation, and the program operation and the read operation are performed on the same memory string, then the same page buffer circuit is used to execute the program operation and the read operation. With respect to the TLC NAND Flash memory device with 5 latches in each page buffer circuit, the suspended program information may include 4 pieces of program information that need to be stored in 4 latches of the page buffer circuit (e.g., as shown in Table 2 of FIG. 7A). In this case, only one latch is left in an idle state and can be used for the read operation during the suspension of the program operation. Since at least two latches (e.g., a sensing latch and another latch) are needed to execute the read operation, the read operation cannot be executed by the page buffer circuit due to the shortage of one latch in the page buffer circuit.

Similarly, with respect to the QLC NAND Flash memory device with 6 latches in each page buffer circuit, the suspended program information may include 5 pieces of program information that need to be stored in 5 latches of the page buffer circuit (e.g., as shown in Table 3 of FIG. 7A). In this case, only one latch is left in an idle state and can be used for the read operation during the suspension of the program operation. Thus, the read operation that needs at least two idle latches cannot be executed by the page buffer circuit due to the shortage of one latch in the page buffer circuit.

To solve the above latch shortage issue in the memory device, one more latch may be added to each page buffer circuit of the TLC or QLC NAND Flash memory device so that the memory device can support the program-operation suspension feature under the non-destructive mode. However, the adding of one more latch in each page buffer circuit may increase the circuit area of the page buffer greatly, which may have an impact on the design and manufacture of the memory device. The cost of the memory device may be increased as well.

To address one or more of the aforementioned issues, the present disclosure introduces a solution that releases two storage units (e.g., two latches) from a page buffer circuit of a memory device to initiate a read operation during a suspension of a program operation. The program operation on a first select memory cell of the memory device and the read operation on a second select memory cell of the memory device can be performed through the page buffer circuit.

For example, the solution disclosed herein can select a piece of program information from suspended program information associated with the program operation, and can store the piece of program information in a memory controller. As a result, two storage units in the page buffer circuit can be configured in an idle state for performing the read operation during the suspension of the program operation. After the read operation is completed, all the suspended program information can be recovered in the page buffer circuit by receiving the piece of program information from the memory controller, and the program operation can then be resumed through the page buffer circuit. Thus, the program-operation suspension feature can be supported by the memory device under the non-destructive mode through the storage of the piece of program information in the memory controller. A trade-off can be achieved between the support of the program-operation suspension feature in the memory device under the non-destructive mode and the usage of storage (or cache) resources and bandwidth resources of the memory controller (e.g., due to the storage of the piece of program information in the memory controller).

In another example, the solution disclosed herein can utilize a dynamic storage unit to store the piece of program information from the suspended program information. Although the dynamic storage unit can only store the piece of program information for a limited amount of time, the dynamic storage unit can be refreshed in a predetermined time interval so that the piece of program information is not lost. As a result, two storage units in the page buffer circuit can be configured in an idle state for performing the read operation during the suspension of the program operation. After the read operation is completed, all the suspended program information can be recovered in the page buffer circuit, and the program operation can then be resumed through the page buffer circuit. Thus, the program-operation suspension feature can be supported by the memory device under the non-destructive mode through the usage of the dynamic storage unit during the suspension of the program operation. Each time when the dynamic storage unit is refreshed, an extra time (e.g., about 400 ns) is consumed, which may have an impact on the read time of the read operation (e.g., the read operation may be delayed). However, the read operation can still be executed as a normal read operation (e.g., like a read operation without the suspension of the program operation). A failed bit count (FBC) of the read operation is not affected by the usage of dynamic storage unit even though the read operation is executed during the suspension of the program operation (e.g., the FBC of the read operation can be like that of the normal read operation).

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104. In order to send or receive data to or from memory devices 104, host 108 can send instructions to memory system 102 besides the data.

Memory device 104 can be any memory device disclosed in the present disclosure. As disclosed below in detail, memory device 104, such as a NAND Flash memory device, can support program operation suspension triggered by an interrupt. Memory device 104 can include memory cells, for example, in NAND memory strings.

Consistent with some aspects of the present disclosure, in some implementations, memory device 104 may suspend an ongoing program operation responsive to an interruption by a read operation on memory device 104. Memory device 104 may store suspended program information associated with the program operation, where a piece of program information from the suspended program information can be stored in memory controller 106 (or a dynamic storage unit in memory device 104). As a result, sufficient storage units of memory device 104 can be released from being occupied by the program operation suspension to perform the read operation. When the read operation is completed, memory device 104 may recover the suspended program information, and may resume the suspended program operation using the suspended program information.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. For example, based on the instructions received from host 108, memory controller 106 may transmit various commands to memory device 104, e.g., a program command, a read command, an erase command, etc., to control the operations of memory device 104.

Consistent with some aspects of the present disclosure, in some implementations, memory controller 106 transmits a program command to memory device 104 to initiate the program operation performed by memory device 104. During the ongoing program operation, interrupts/suspensions can occur, for example, from host 108, and memory controller 106 can be configured to transmit one or more suspension commands to memory device 104 to cause one or more suspensions during the program operation. In some implementations, once the other operation triggered by each suspension (e.g., a read operation) is completed, memory controller 106 can be further configured to transmit a resume command to memory device 104 to resume the suspended program operation. Memory controller 106 is described below in more detail with reference to FIG. 6B.

Memory controller 106 can also be configured to manage various functions with respect to the data stored or to be stored in memory device 104 including, but not limited to, bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
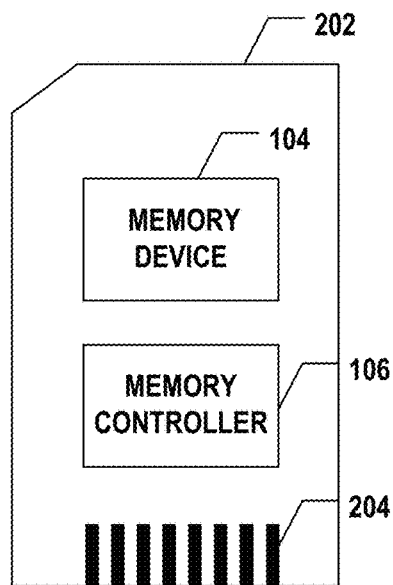
FIG. 2A illustrates a diagram of a memory card having a memory device, according to some aspects of the present disclosure.
Figure 2B:
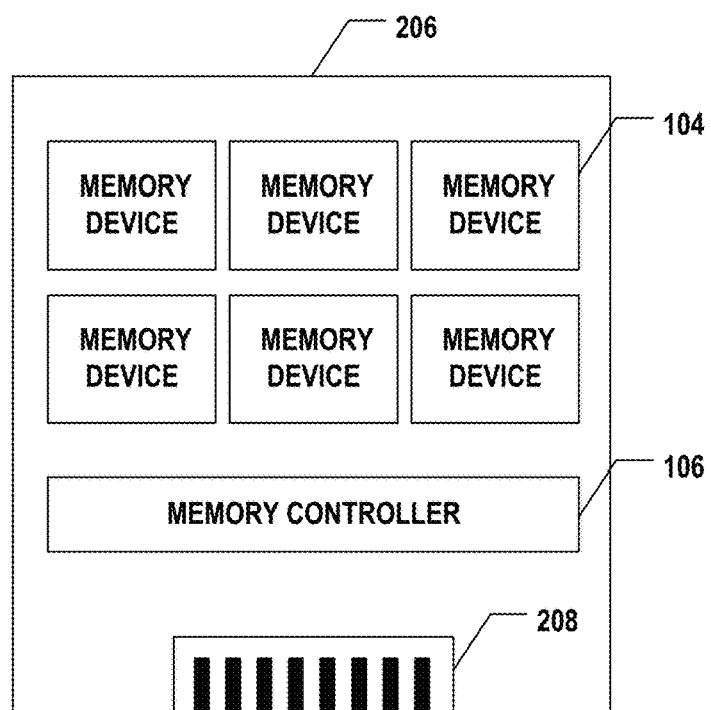
FIG. 2B illustrates a diagram of a solid-state drive (SSD) having a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 configured to couple memory card 202 to a host (e.g., host 108 in FIG. 1). In another example as shown in FIG. 2B, memory controller 106 and multiple memory devices 104 may be integrated into an SSD 206. SSD 206 can further include an SSD connector 208 configured to couple SSD 206 to a host (e.g., host 108 in FIG. 1). In some implementations, the storage capacity and/or the operation speed of SSD 206 is greater than those of memory card 202.

Figure 3:
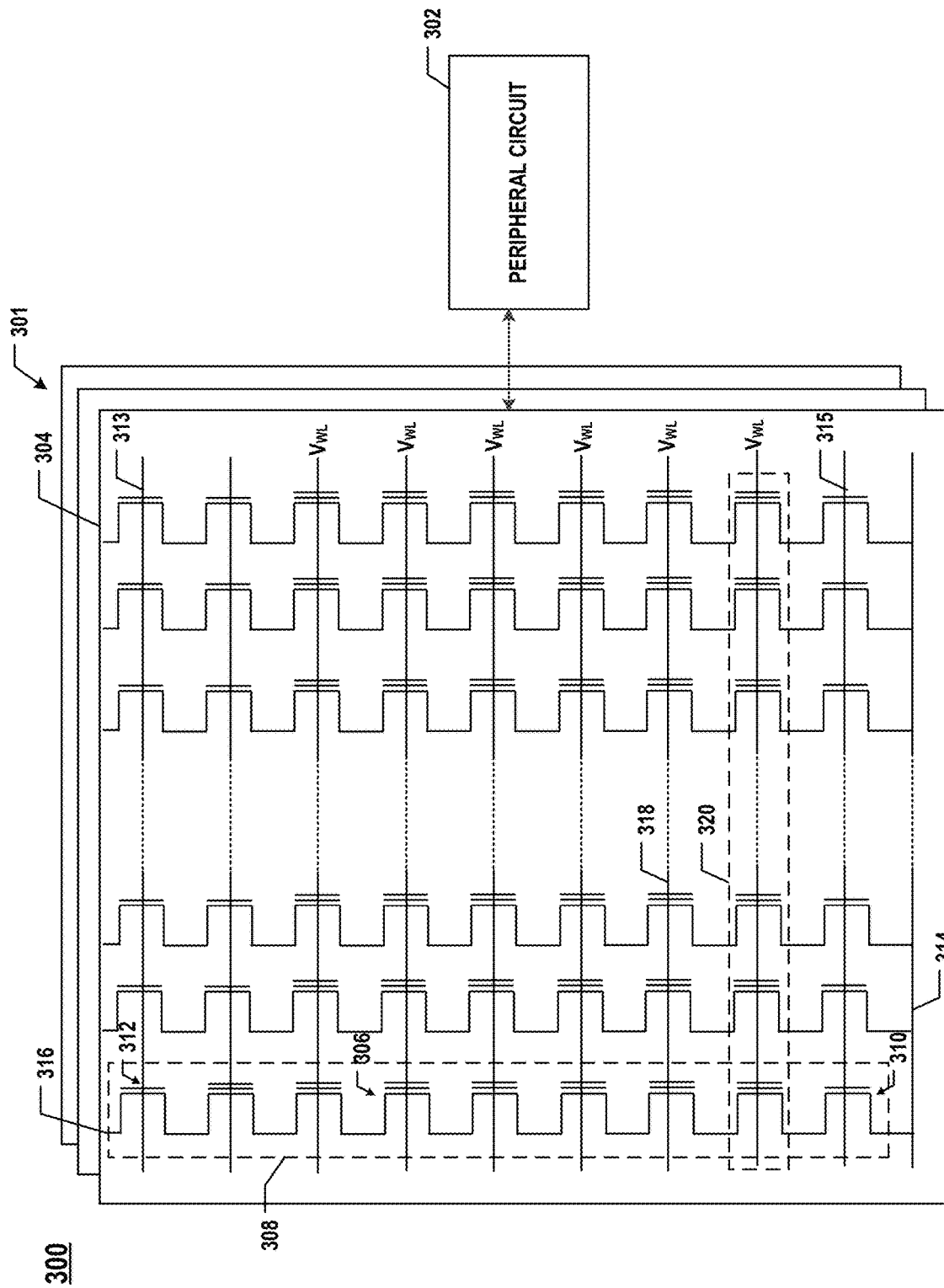
FIG. 3 illustrates a schematic diagram of a memory device including peripheral circuits, according to some aspects of the present disclosure.

FIG. 3 illustrates a schematic circuit diagram of an exemplary memory device 300 including peripheral circuits 302, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is a single-level cell (SLC) that has two possible memory states and thus, can store one bit of data. For example, the first memory state "0" can correspond to a first range of voltages, and the second memory state "1" can correspond to a second range of voltages. In some implementations, each memory cell 306 is a multi-level cell (MLC) that is capable of storing more than a single bit of data in more than four memory states. For example, the MLC can store two bits per cell, three bits per cell (also known as TLC), or four bits per cell (also known as QLC). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate select NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (AC S), according to some implementations. The drain of each NAND memory string 308 is coupled to a respective bit line 316 from which data can be read or written via an output bus (not shown), according to some implementations. In some implementations, each NAND memory string 308 is configured to be selected or deselected by applying a DSG select voltage or a DSG unselect voltage to the gate of respective DSG transistor 312 through one or more DSG lines 313 and/or by applying an SSG select voltage or an SSG unselect voltage to the gate of respective SSG transistor 310 through one or more SSG lines 315.

As shown in FIG. 3, NAND memory strings 308 can be organized into multiple blocks 304, each of which can have a common source line 314, e.g., coupled to an ACS. In some implementations, each block 304 is the basic data unit for erase operations, i.e., all memory cells 306 on the same block 304 are erased at the same time. To erase memory cells 306 in a select block 304, source lines 314 coupled to select block 304 as well as unselect blocks 304 in the same plane as select block 304 can be biased with an erase voltage (Vers), such as a high positive voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program and read operations. The size of one page 320 in bits can relate to the number of NAND memory strings 308 coupled by word line 318 in one block 304. Each word line 318 can include a plurality of control gates (gate electrodes) at each memory cell 306 on respective page 320 and a gate line coupling the control gates.

Figure 4A:
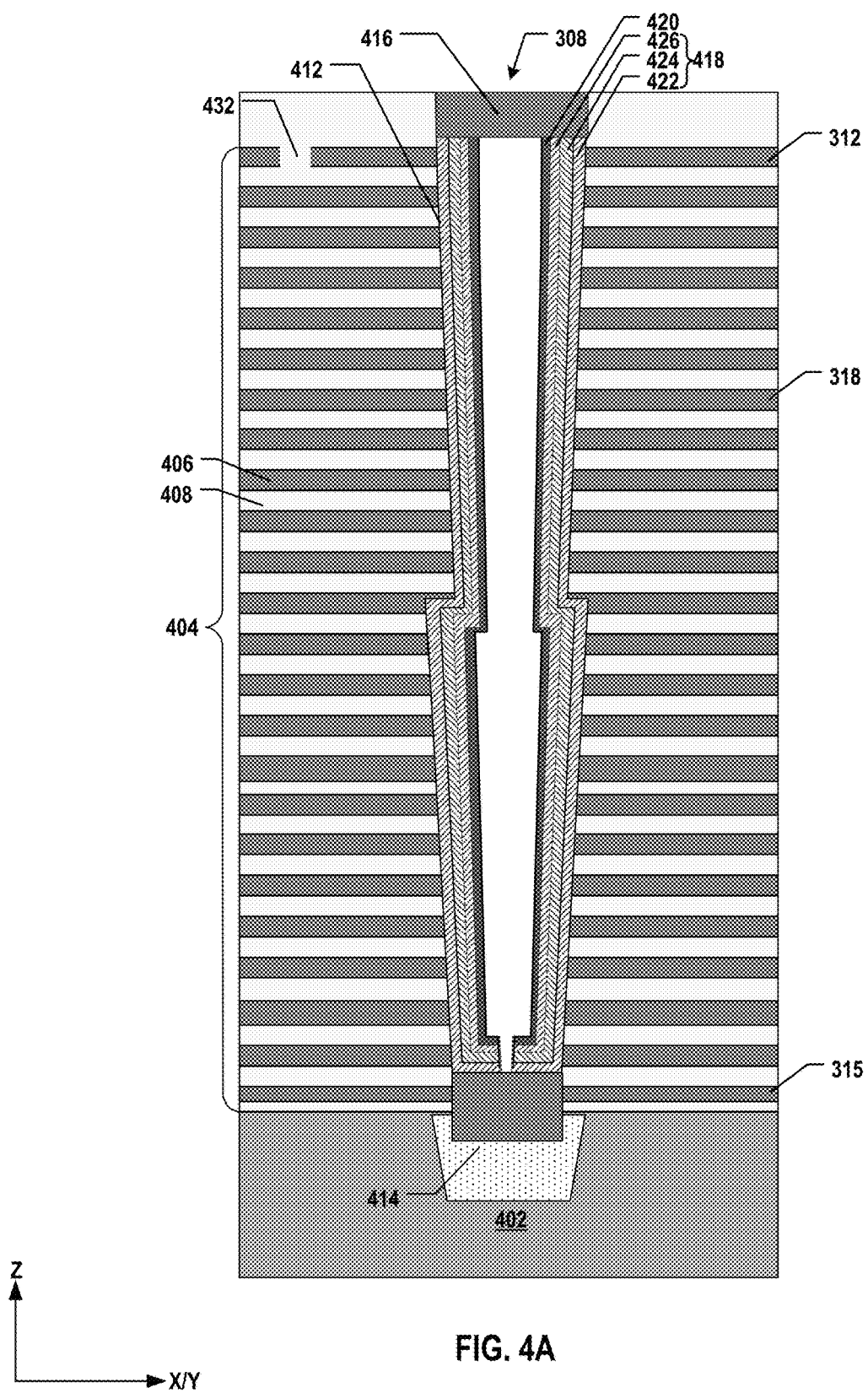
FIGS. 4A and 4B illustrate a side view and a plan view of cross-sections of a memory cell array including a NAND memory string, respectively, according to some aspects of the present disclosure.
Figure 4B:
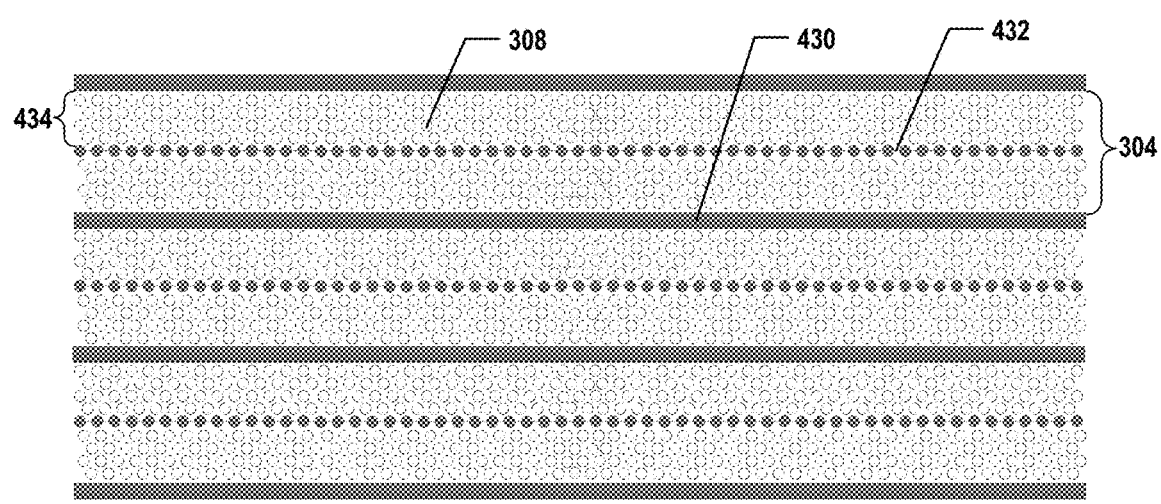

FIGS. 4A and 4B illustrate a side view and a plan view of cross-sections of an exemplary memory cell array 301 including NAND memory strings 308, respectively, according to some aspects of the present disclosure. As shown in FIG. 4A, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials. It is noted that x, y, and z axes are included in FIG. 4A to further illustrate the spatial relationship of the components in a memory device. Substrate 402 includes two lateral surfaces extending laterally in the x-y plane: a top surface on the front side of the wafer on which the memory device can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the memory device is determined relative to substrate 402 of the memory device in the z-direction (the vertical direction perpendicular to the x-y plane) when substrate 402 is positioned in the lowest plane of the memory device in the z-direction. The same notion for describing the spatial relationships is applied throughout the present disclosure.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include the control gates of memory cells 306, the gates of DSG transistors 312, or the gates of SSG transistors 310, and can extend laterally as DSG line 313 in the upper portion of memory stack 404, SSG line 315 in the lower portion of memory stack 404, or word line 318 between DSG line 313 and SSG line 315. It is understood that although one SSG line 315 and one DSG line 313 are shown in FIG. 4A, the number of SSG lines 315 and the number of DSG lines 313 (as well as the numbers of SSG transistors 310 and DSG transistors 312 coupled to the SSG lines 315 and DSG lines 313, respectively) may vary in other examples.

As shown in FIG. 4A, NAND memory string 308 includes a channel structure 412 extending vertically through memory stack 404. In some implementations, channel structure 412 includes a channel opening filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4A, a well 414 (e.g., a P-well and/or an N-well) is formed in substrate 402, and the source of NAND memory string 308 is in contact with well 414, according to some implementations. For example, source line 314 may be coupled to well 414 to apply an erase voltage to well 414, i.e., the source of NAND memory string 308, during erase operations.

As shown in the plan view of FIG. 4B, NAND memory strings 308 of memory cell array 301 can be arranged into blocks 304 by slit structures 430 (e.g., gate line slits (GLSs)), which electrically separate word lines 318 between adjacent blocks 304, such that each block 304 can be individually controlled in read, program, and erase operations. In one example, each slit structure 430 may extend along the x-direction (e.g., the word line direction), and multiple blocks 304 may be arranged along they-direction (e.g., the bit line direction). In some implementations, each block 304 can be further divided into smaller areas (e.g., fingers 434) by DSG cuts 432, which electrically separate DSG lines 313 between adjacent fingers 434, such that DSG lines 313 in different fingers 434 may be individually controlled in read and program operations.

Figure 5A:
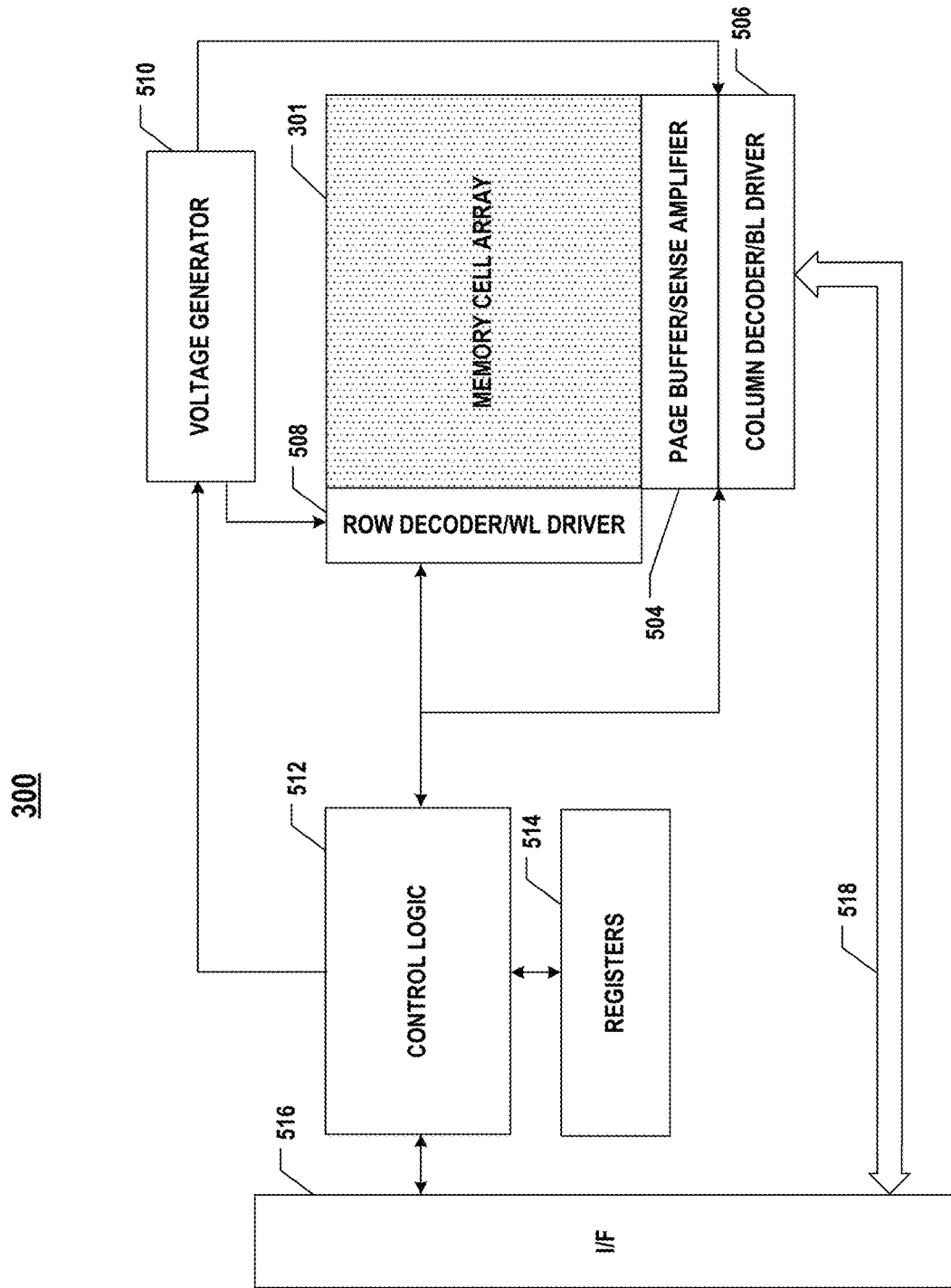
FIG. 5A illustrates a block diagram of a memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target (select) memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5A illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5A may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may perform program verify operations to ensure that the data has been properly programmed into select memory cells 306 coupled to select word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic 512 and select one or more NAND memory strings 308 by applying bit line voltages generated from voltage generator 510.

Row decoder/word line driver 508 can be configured to be controlled according to the control signals by control logic 512 and select/unselect blocks 304 of memory cell array 301 and select/unselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315, and DSG lines 313 as well using SSG voltages and DSG voltages generated from voltage generator 510.

Voltage generator 510 can be configured to be controlled by control logic 512 and generate the various word line voltages (e.g., read voltage, program voltage, pass voltage, verification voltage), SSG voltages (e.g., select/unselect voltages), DSG voltages (e.g., select/unselect voltages), bit line voltages (e.g., ground voltage), and source line voltages (e.g., ground voltage) to be supplied to memory cell array 301.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit.

In some implementations, control logic 512 can receive a program command issued by a memory controller (e.g., memory controller 106 in FIG. 1) and send control signals to various peripheral circuits, such as row decoder/word line driver 508, column decoder/bit line driver 506, and voltage generator 510 to initiate the program operation on select memory cells 306 coupled to select word line 318. In response to receiving a suspension command issued by the memory controller during the ongoing program operation, control logic 512 can send control signals to various peripheral circuits, such as row decoder/word line driver 508, column decoder/bit line driver 506, and voltage generator 510, to suspend the program operation and initiate another operation triggered by the suspension command (e.g., a read operation). In some implementations, registers 514 are configured to store the information of the suspended program operation, such as the programming page, the program pass, and the program/verify cycle at which the program operation is suspended, etc., which is needed for resuming the suspended program operation. In some implementations, control logic 512 is configured to check the status of the other operation from status registers of registers 514. In response to completion of the other operation (e.g., read operation), control logic 512 is further configured to retrieve the information of the suspended program operation stored in registers 514 and send control signals to various peripheral circuits, such as row decoder/word line driver 508, column decoder/bit line driver 506, and voltage generator 510 to resume the suspended read operation based on the retrieved information from registers 514, according to some implementations. Control logic 512 is described below in more detail with reference to FIGS. 6A, 7A-7C, 8, and 10-14.

Interface 516 can be coupled to control logic 512 and act as a control buffer to buffer and relay control commands (e.g., program command and suspension command) received from a memory controller (e.g., memory controller 106 in FIG. 1) to control logic 512 and information (e.g., a piece of program information) received from control logic 512 to the memory controller. Interface 516 can also be coupled to column decoder/bit line driver 506 via data bus 518 and act as a data input/output (I/O) interface and a data buffer to buffer and relay the data to and from memory cell array 301.

Each memory cell 306 in memory cell array 301 can be configured to store a piece of N-bits data in one of $2^N$ levels, where N is an integer greater than 1 (e.g., N=2 for MLCs, N=3 for TLCs, N=4 for QLCs, etc.). The N-bits data may include 2 N pieces of data in $2^N$ levels, respectively. Each level can correspond to one of $2^N$ threshold voltage (Vth) ranges of memory cells 306. Taking TLCs, where N=3, for example, memory cell 306 may be programmed into one of 8 levels, including one level of the erased state and 7 levels of the programmed states. Each level may correspond to a respective threshold voltage (Vth) range of memory cells 306. For example, the level corresponding to the lowest threshold voltage range may be considered as level 0, the level corresponding to the second-lowest threshold voltage range may be considered as level 1, and so until level 7 corresponding to the highest threshold voltage range.

On the other hand, each level can correspond to one of the $2^N$ pieces of N-bits data that is to be stored in select memory cell 306. In some implementations, the $2^N$ pieces of N-bits data may be represented by (in the form of) a gray code. A gray code (a.k.a., reflected binary code (RBC) or reflected binary (RB)) is an ordering of the binary numeral system such that two successive values differ in only one bit (binary digit). For example, TABLE 1 below shows an example of a binary code representing a one-to-one mapping between 8 levels (LV 0 to LV 7) and 8 pieces of 3-bits data. As shown in TABLE 1 of FIG. 5B, each piece of 3-bits data may include three bits of binary values (b1, b2, and b3). In one example, level 1 may correspond to a piece of 3-bits data having a value of 000. In another example, level 7 may correspond to another piece of 3-bits data having a value of 101.

Also referring to FIG. 5A, in a program operation, a data page having N pages (a.k.a. pieces) of the N-bits data can be used to program a select row of memory cells 306 coupled to select word line 318. In other words, peripheral circuits 302 can be configured to program a select row of memory cells 306 based on a current data page, which has N pieces of the N-bits data. In some implementations, user data is transmitted through data bus 518 to page buffer/sense amplifier 504, and page buffer/sense amplifier 504 is configured to convert the user data into each data page to be programmed into a respective row of memory cells 306 based on a preset gray code. Based on the preset gray code, which defines the mapping of each programmed level and a respective piece of N-bits data, control logic 512 is configured to send control signals (e.g., enable signals) to page buffer/sense amplifier 504 to allow page buffer/sense amplifier 504 to generate corresponding data pages for respective program operations. During the ongoing program operation, the current data page can be temporarily stored in page buffer/sense amplifier 504, and page buffer/sense amplifier 504 can be configured to provide to each memory cell 306 (coupled to select word line 318) the corresponding piece of N-bits data through the corresponding bit line 316. The corresponding piece of N-bits data may include N portions of page data (e.g., N bits from the current data page, with each portion of page data corresponding to a respective bit of the N bits from the current data page).

For example, for N=3, a select row of memory cells 306 (e.g., a page) may include 3 select memory cells 306 coupled to select word line 318. The current data page may include 3 pieces of the 3-bits data including, e.g., 110 (the first piece of the 3-bits data), 001 (the second piece of the 3-bits data), and 101 (the third piece of the 3-bits data). During the ongoing program operation on select row of memory cells 306, level 5 corresponding to 110, level 4 corresponding to 001, and level 7 corresponding to 101 are programmed into the 3 select memory cells 306, respectively. In this example, each of the first, second, or third piece of the 3-bits data may include 3 portions of page data, with each portion of page data corresponding to a respective bit of the corresponding 3 bits from the first, second, or third piece of the 3-bits data.

Also referring to FIG. 5A, in a read operation, a data page having N pieces of the N-bits data stored in a select row of memory cells 306 coupled to select word line 318 can be read out from select row of memory cells 306 though corresponding bit lines 316. For example, control logic 512 is configured to send control signals (e.g., enable signals) to page buffer/sense amplifier 504 (and any other suitable peripheral circuit) to allow page buffer/sense amplifier 504 to read the data page from select row of memory cells 306 and output the data page to I/O 516.

Figure 6A:
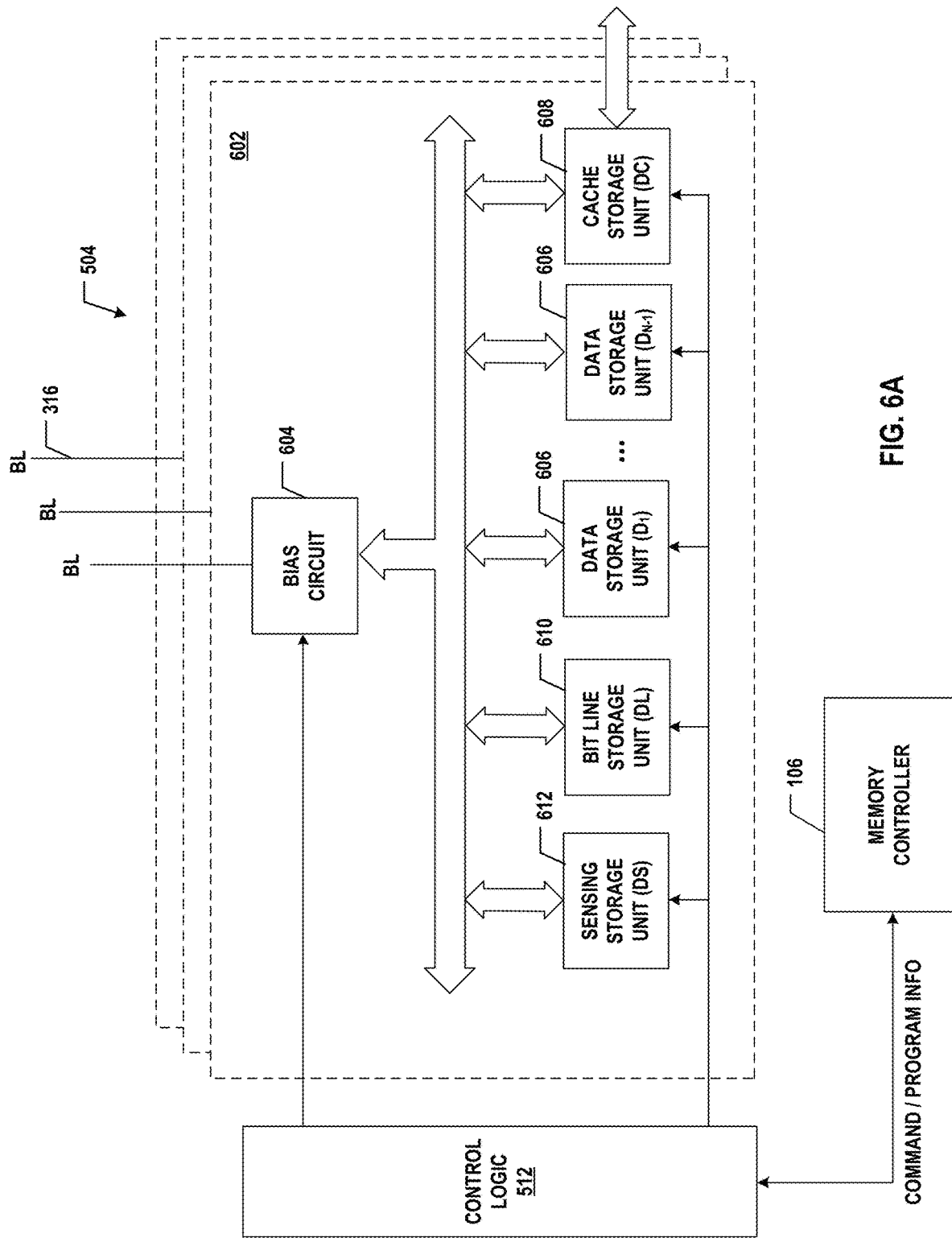
FIG. 6A illustrates a detailed block diagram of an exemplary structure of a page buffer, according to some aspects of the present disclosure.

FIG. 6A illustrates a detailed block diagram of an exemplary structure of a page buffer (e.g., page buffer/sense amplifier 504), according to some aspects of the present disclosure. In some implementations, the page buffer in FIG. 6A includes a plurality of page buffer circuits 602 each coupled to a respective one of bit lines 316. In other words, each page buffer circuit 602 can be coupled to a respective column of memory cells 306 (e.g., NAND memory string 308) through a corresponding bit line 316 and configured to temporarily store a piece of N-bits data that is used for programming a respective select memory cell 306 (coupled to select word line 318 and the corresponding bit line 316) in a program operation. All page buffer circuits 602 together can temporarily store the entire current data page (e.g., N pieces of the N-bits data) that are used for programming select row of memory cells 306 (e.g., a page 320 of memory cells 306) coupled to select word line 318 in the program operation. As described above, in some implementations, each page buffer circuit 602 is also configured to pre-process a respective portion of the user data received from data bus 518 and convert it to the corresponding piece of N-bits data based on a preset gray code. The corresponding piece of N-bits data may include N portions of page data (e.g., N bits from the current data page). For example, for TLCs where N=3, each page buffer circuit 602 may be configured to temporarily store a respective set of the 8 sets of 3 bits of the current data page as shown in TABLE 1 above, which correspond to 8 levels, respectively.

In some implementations, each page buffer circuit 602 can include a plurality of storage units and a bias circuit 604. The plurality of storage units may include N−1 data storage units ($D_1, \ldots, D_{N-1}$) 606, a cache storage unit (DC) 608, a bit line (BL) storage unit (DL) 610, and a sensing storage unit (DS) 612.

During the current ongoing program operation for programming a select row of memory cells 306 based on a current data page, each of N−1 data storage units 606 can be configured to store a respective portion of page data from the piece of the N-bits data (e.g., a respective bit of the corresponding N bits from the current data page). As a result, N−1 data storage units 606 can store N−1 portions of page data from the piece of the N-bits data (e.g., N−1 bits of the corresponding N bits from the current data page).

To reduce the number of storage units and the size of page buffer circuit 602, the number of cache storage unit 608 is limited to one, i.e., a single cache storage unit 608 that can store only a single bit of data at the same time, according to some implementations. Existing multi-cache data loading schemes may require the number of data storage units in each page buffer circuit 602 to be at least the same as the number of bits in the piece of N-bits data used for programming the corresponding select memory cell 306, i.e., N data storage units, because the single cache storage unit is dedicated to caching the data of the next data page. Different from the existing schemes and consistent with the scope of the present disclosure, the single cache storage unit 608 in page buffer circuit 602 in FIG. 6A can also be configured to store one of the corresponding N bits from the current data page. That is, cache storage unit 608 is configured to sequentially store one of the corresponding N bits from the current data page and each of the corresponding N bits from the next data page, according to some implementations. In other words, cache storage unit 608 can act as both a data storage unit and a cache storage unit in a time-division manner to replace one of data storage units 606 in each page buffer circuit 602. In some implementations, as shown in FIG. 6A, the number of data storage units 606 in each page buffer circuit 602 thus becomes N−1 ($D_1$ to $D_{N-1}$). The total number of data storage units 606 and cache storage unit 608 thus can be reduced from N+1 to N, compared with the existing multi-cache data loading schemes.

It is understood that a total of N data storage units 606 and cache storage unit 608 may reduce the data loading window by caching N−1 bits of the N bits of the next data page in programming the current select row of memory cells based on the current data page, but may not be able to completely avoid the data loading window. Thus, consistent with the scope of the present disclosure, in some implementations, another storage unit in each page buffer circuit 602 for storing non-data page information is configured to sequentially store the non-data page information and one of the N bits of the next data page, thereby enabling the caching of all N−1 bits of the next data page in the current program operation to avoid the data loading windows. That is, page buffer circuit 602 can include a multipurpose storage unit that can store the non-data page information and cache the data of the next data page in a time-division manner.

In some implementations, sensing storage unit (DS) 612 and BL storage unit (DL) 610 may be configured to store non-data page information, i.e., any information other than the data bits in a data page. For example, sensing storage unit (DS) 612 may be configured to store information indicative of whether the current operation performed by page buffer/sense amplifier 504 is a read operation or a program operation. BL storage unit (DL) 610 (e.g., a 3BL storage unit) may be configured to store the bias information of the respective bit line 316 coupled to page buffer circuit 602. In some implementations, BL storage unit 610 may be a multipurpose storage unit that acts as both a BL storage unit and a cache storage unit in a time-division manner. Bias circuit 604 may be coupled to a respective bit line 316 and configured to apply a bit line voltage to corresponding select memory cell 306 coupled to a respective bit line 316 in the program operation. Depending on whether the corresponding select memory cell 306 passes the verification at the respective level according to the N-bits of data for programming the select memory cell 306, for example, a high voltage level and a low voltage level, can be used as the bit line voltage to bias the respective bit line 316. In some implementations, to optimize the threshold voltage distributions, for example, enlarging the read margins between adjacent levels and reducing the width of each level, a medium voltage level is used as well for biasing the bit line voltage. That is, three voltage levels, e.g., high, medium, and low, can be applied to the respective bit line 316 (referred to herein as 3BL). In some implementations, a voltage level applied to the respective bit line 316 (e.g., 3BL bias) is non-data page information stored in BL storage unit 610.

It is understood that although BL storage unit 610 is described herein as an example of the multipurpose storage unit, any suitable non-data page storage units in page buffer circuit 602, such as sensing storage unit 612, or any other non-data page storage units not shown in FIG. 6A, may be used as the multipurpose storage unit in some examples without adding additional storage units into page buffer circuit 602. It is also understood that each storage unit in page buffer circuit 602, including each data storage unit 606, cache storage unit 608, BL storage unit 610, and sensing storage unit 612, may be any circuit that has two stable states for storing a single bit of data, such as a latch or a flip-flop. In one example, each of data storage units 606, cache storage unit 608, BL storage unit 610, and sensing storage unit 612 may include a latch. In some implementations, page buffer circuit 602 has a 5-latch configuration that includes one cache latch, two data latches, one 3BL latch, and one sensing latch for a TLC memory device. In some implementations, page buffer circuit 602 has a 6-latch configuration that includes one cache latch, three data latches, one 3BL latch, and one sensing latch for a QLC memory device.

An exemplary process for initiating a read operation during a suspension of a program operation in a non-destructive mode is illustrated herein with reference to FIG. 6A. Initially, control logic 512 may receive a program command from memory controller 106 to initiate a program operation on a first select row of memory cells 306 (including a first memory cell 306). If a read command to execute a read operation on a second select row of memory cells 306 (including a second memory cell 306) is issued to interrupt the program operation, control logic 512 may receive a suspension command issued by memory controller 106. The suspension command may indicate to suspend the ongoing program operation on first select row of memory cells (including first memory cell 306) and to initiate the read operation on second select row of memory cells 306 (including second memory cell 306). First and second memory cells 306 may be in the same NAND memory string 308 and coupled to the same page buffer circuit 602 through the same bit line 316. Then, control logic 512 can send control signals to various peripheral circuits, such as row decoder/word line driver 508, column decoder/bit line driver 506, and voltage generator 510, to suspend the program operation and initiate the read operation triggered by the suspension command.

Specifically, control logic 512 may be configured to suspend the program operation on first select row of memory cells 306 (including first memory cell 306) responsive to receiving the suspension command indicative of executing the read operation on second select row of memory cells 306 (including second memory cell 306). Control logic 512 may control page buffer circuit 602 to store suspended program information associated with the suspended program operation.

For example, the program operation may be configured to write a piece of N-bits data at one of $2^N$ levels to first memory cell 306, where the piece of N-bits data includes N portions of page data (e.g., N bits from the current data page). The suspended program information may include N+1 pieces of program information (e.g., including inhibit information and the N portions of page data) associated with the program operation. The inhibit information may include any non-data page information associated with the program operation and can be used to resume the program operation on first memory cell 306 when the read operation completes. For example, the inhibit information may indicate whether a program verification on first memory cell 306 has passed or not. Control logic 512 may control page buffer circuit 602 to store the N portions of page data and the inhibit information in N+1 storage units of page buffer circuit 602, respectively. The N+1 storage units are storage units selected from sensing storage unit 612, BL storage unit 610, N−1 data storage units 606, and cache storage unit 608. Exemplary suspended program information stored in page buffer circuit 602 is illustrated below in more detail with reference to FIG. 7A.

Next, control logic 512 may be configured to control page buffer circuit 602 to release sensing storage unit 612 and cache storage unit 608 from being occupied by the suspension of the program operation through a storage of a piece of program information in memory controller 106, where the piece of program information is from the suspended program information. The piece of program information may include one of the inhibit information and the N portions of page data to be stored in memory controller 106. A remaining portion of the suspended program information (e.g., a remaining portion of the inhibit information and the N portions of page data) can include the inhibit information and the N portions of page data except for the piece of program information stored in memory controller 106.

For example, control logic 512 may select one of the inhibit information and the N portions of page data as the piece of program information to be stored in memory controller 106. Control logic 512 may control page buffer circuit 602 to send the piece of program information to memory controller 106 for storage. Control logic 512 may also control page buffer circuit 602 to store the remaining portion of the inhibit information and the N portions of page data in BL storage unit 610 and N−1 data storage units 606, respectively.

In another example, memory controller 106 may be configured to pre-store the piece of program information (e.g., before the suspension of the program operation). In this case, there is no need for page buffer circuit 602 to send the piece of program information to memory controller 106 for storage. Instead, control logic 512 may determine the piece of program information that is pre-stored in memory controller 106, and may determine the remaining portion of the inhibit information and the N portions of page data to be stored in page buffer circuit 602. Control logic 512 may control page buffer circuit 602 to store the remaining portion of the inhibit information and the N portions of page data in BL storage unit 610 and N−1 data storage units 606, respectively.

In either example, if the piece of program information includes one of the N portions of page data, control logic 512 may control page buffer circuit 602 to store the inhibit information in BL storage unit 610. Control logic 512 may also control page buffer circuit 602 to store N−1 remaining portions of page data in N−1 data storage units 606, respectively. On the other hand, if the piece of program information includes the inhibit information, control logic 512 may control page buffer circuit 602 to store the N portions of page data in BL storage unit 610 and N−1 data storage units 606, respectively. As a result, sensing storage unit 612 and cache storage unit 608 are released to be in an idle state so that the read operation can be performed through sensing storage unit 612 and cache storage unit 608. Exemplary remaining portion of the suspended program information stored in page buffer circuit 602 is illustrated below in more detail with reference to FIGS. 7B-7C.

Further, responsive to sensing storage unit 612 and cache storage unit 608 being released from being occupied by the suspension of the program operation, control logic 512 may be configured to initiate the read operation on second memory cell 306 using sensing storage unit 612 and cache storage unit 608. In some implementations, sensing storage unit 612 may be coupled to a NAND memory string 308 (e.g., including first and second memory cells 306), and may be optimized for sensing data (e.g., a voltage level) stored in a respective memory cell 306 of NAND memory string 308. Cache storage unit 608 may be coupled to interface 516 to receive or send data from or to interface 516. Thus, sensing storage unit 612 may be used to sense the data stored in respective memory cell 306 of NAND memory string 308 and forward the sensed data to cache storage unit 608, causing cache storage unit 608 to output the sensed data to interface 516.

For example, control logic 512 may control sensing storage unit 612 to sense the data stored in second memory cell 306 and to generate a read signal correspondingly. Control logic 512 may control page buffer circuit 602 to store the read signal from second memory cell 306 in sensing storage unit 612. Then, control logic 512 may control page buffer circuit 602 to send the read signal from sensing storage unit 612 to cache storage unit 608. Control logic 512 may also control page buffer circuit 602 to send the read signal from cache storage unit 608 to interface 516 of memory device 300.

When the read operation on second memory cell 306 completes, control logic 512 may be further configured to control page buffer circuit 602 to restore the suspended program operation based on the piece of program information received from memory controller 106. For example, control logic 512 may control page buffer circuit 602 to receive the piece of program information from memory controller 106 to recover the inhibit information and the N portions of page data in page buffer circuit 602. Control logic 512 may control page buffer circuit 602 to re-save the N portions of page data and the inhibit information in the N+1 storage units from sensing storage unit 612, BL storage unit 610, N−1 data storage units 606, and cache storage unit 608, respectively. Then, after the suspended program information is recovered based on the piece of information received from memory controller 106, control logic 512 may control page buffer circuit 602 to resume the program operation on first memory cell 306 using the suspended program information.

Figure 6B:
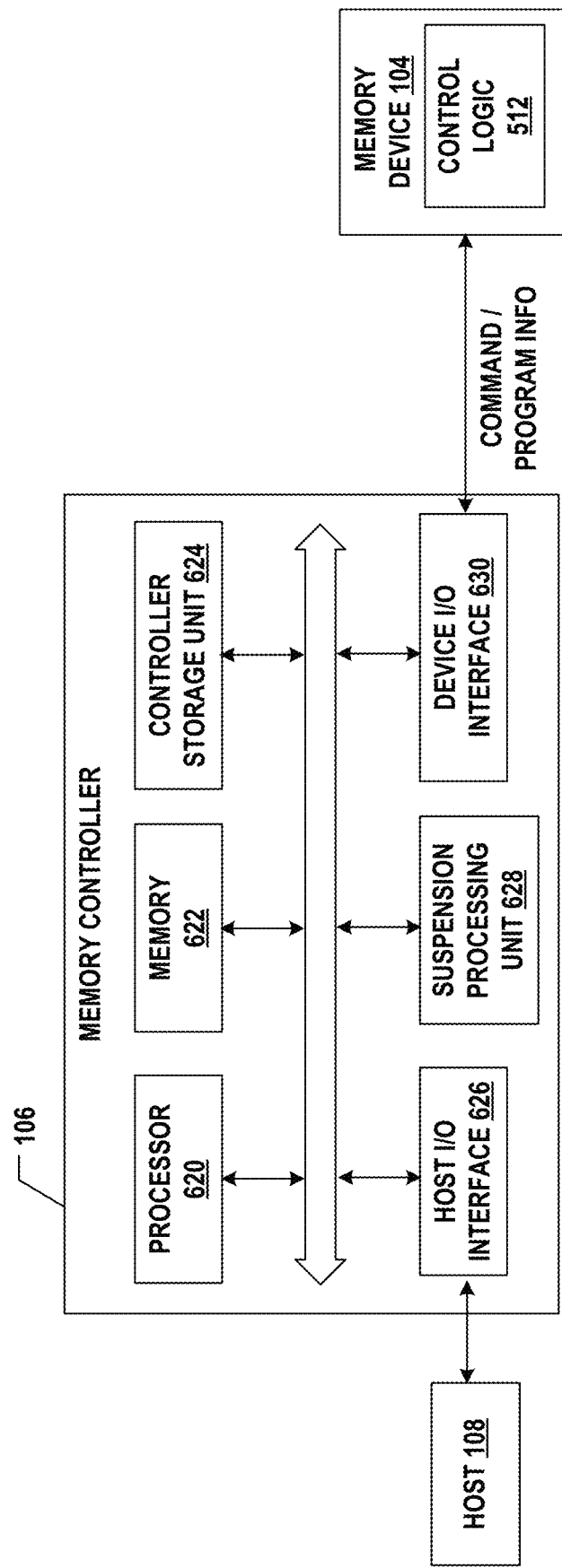
FIG. 6B illustrates a detailed block diagram of an exemplary structure of a memory controller, according to some aspects of the present disclosure.

FIG. 6B illustrates a detailed block diagram of an exemplary structure of a memory controller (e.g., memory controller 106), according to some aspects of the present disclosure. Memory controller 106 may include at least one of a processor 620, a memory 622, a controller storage unit 624, a host input/output (I/O) interface 626, a suspension processing unit 628, or a device I/O interface 630. FIG. 6B will be described below with combined reference to FIG. 6A.

Processor 620 can be any suitable type of processors, for example, a central processing unit (CPU), a microprocessor, a system-on-chip (SoC), or an application processor (AP), etc. Processor 620 may include various computing architectures including a complex instruction set computer (CISC) architecture, a reduced instruction set computer (RISC) architecture, or an architecture implementing a combination of instruction sets. Although only a single processor is shown in FIG. 6B, multiple processors may be included. Processor 620 can be configured to send or receive data to or from memory 622. For example, processor 620 can be configured to receive instructions from memory 622 and execute the instructions to provide the functionality described herein.

Memory 622 stores data that may include code or routines for performing part of or all of the techniques described herein. Memory 622 may be a dynamic random access memory (DRAM) device, a static random access memory (SRAM) device, a hard disk drive, a floppy disk drive, a CD-ROM device, a DVD-ROM device, a DVD-RAM device, a DVD-RW device, a flash memory device (e.g., NAND Flash memory device), or some other suitable memory device.

Controller storage unit 624 can be any suitable storage unit included in memory controller 106. For example, controller storage unit 624 may be a cache storage unit or a data storage unit. In another example, controller storage unit 624 may be a latch or a flip-flop. In some implementations, controller storage unit 624 may be configured to store a piece of program information associated with a suspended program operation. Alternatively, the piece of program information may be stored in memory 622. Although a single controller storage unit is shown in FIG. 6B, it is understood that memory controller 106 may include a plurality of controller storage units.

Host I/O interface 626 may be an interface that couples memory controller 106 to host 108. For example, host I/O interface 626 may include one or more of a network interface, a universal serial bus (USB), a thunderbolt, or any other suitable type of interface capable of outputting or receiving data to or from host 108. Similarly, device I/O interface 630 may be an interface that couples memory controller 106 to memory device 104. For example, device I/O interface 630 may include any suitable type of interface capable of outputting or receiving data to or from memory device 104.

Suspension processing unit 628 may be coupled to the other components of memory controller 106, respectively. In some implementations, suspension processing unit 628 may be configured to send a command (e.g., a program command, a read command, or a suspension command) received from host 108 to control logic 512 of memory device 104 through device I/O interface 630. In some implementations, suspension processing unit 628 can be configured to handle a suspension of a program operation responsive to receiving a suspension command from host 108 through host I/O interface 626.

Specifically, suspension processing unit 628 may send the suspension command to control logic 512 of memory device 104 to suspend an ongoing program operation on a first memory cell 306 and to initiate a read operation on a second memory cell 306. First and second memory cells 306 are coupled to the same page buffer circuit 602 through the same bit line 316. Suspension processing unit 628 may be configured to store a piece of program information in memory 622 or controller storage unit 624, so that sensing storage unit 612 and cache storage unit 608 of page buffer circuit 602 can be released from being occupied by the suspension of the program operation and used for the read operation. The piece of program information may include inhibit information associated with the suspended program operation or a portion of page data from the N portions of page data to be programmed into first memory cell 306.

For example, suspension processing unit 628 may receive the piece of program information from memory device 104 through device I/O interface 630 and store the piece of program information in memory 622 or controller storage unit 624. In this case, the content of the piece of program information can be determined by control logic 512 of memory device 104 during or after the occurrence of the program operation suspension. In another example, suspension processing unit 628 may select one of the N portions of page data and the inhibit information to be the piece of program information, and may store the piece of information in memory 622 or controller storage unit 624. In this case, the content of the piece of program information can be determined by suspension processing unit 628, and there is no need to send the piece of information from memory device 104 to memory controller 106. If the piece of program information is a portion of page data from the N portions of page data, suspension processing unit 628 may pre-store the piece of program information before the occurrence of the program operation suspension.

Further, responsive to completion of the read operation on second memory cell 306, suspension processing unit 628 may be configured to send the piece of program information to page buffer circuit 602 of memory device 104 through device I/O interface 630. The piece of program information can be used to recover the suspended program information in page buffer circuit 602, so that the program operation can be resumed through page buffer circuit 602.

In some implementations, suspension processing unit 628 may include a programmable logic device (PLD) (e.g., a field-programmable logic array (FPGA)) that is configured to provide the functionality described herein. In some implementations, in response to the execution of instructions or other data stored in memory 622, processor 620 can be configured to implement the functionality of suspension processing unit 628.

FIG. 7A is a graphical representation illustrating exemplary suspended program information stored in a page buffer circuit (e.g., page buffer circuit 602) before an execution of a read operation, according to some aspects of the present disclosure. The suspended program information is associated with a program operation on a first memory cell 306, where the program operation is interrupted by the read operation on a second memory cell 306. Both first and second memory cells 306 are coupled to page buffer circuit 602 through the same bit line 316.

Table 2 in FIG. 7A illustrates suspended program information stored in page buffer circuit 602 before the execution of the read operation with respect to a TLC memory device, where page buffer circuit 602 has a 5-latch configuration. In Table 2, the program operation is configured to program a piece of 3-bits data at one of 8 levels to first memory cell 306, where the piece of 3-bits data includes 3 portions of page data (e.g., 3 bits from a current data page). By way of examples, inhibit information associated with the program operation is stored in sensing storage unit 612, and the 3 portions of page data (denoted as upper page (UP) data, middle page (MP) data, and lower page (LP) data, respectively) are stored in BL storage unit 610, data storage unit ($D_2$) 606, and data storage unit ($D_1$) 606, respectively.

Table 3 in FIG. 7A illustrates suspended program information stored in page buffer circuit 602 before the execution of the read operation with respect to a QLC memory device, where page buffer circuit 602 has a 6-latch configuration. In Table 3, the program operation is configured to program a piece of 4-bits data at one of 16 levels to first memory cell 306, where the piece of 4-bits data includes 4 portions of page data (e.g., 4 bits from the current data page). By way of examples, inhibit information associated with the program operation is stored in sensing storage unit 612, and the 4 portions of page data (denoted as LP data, MP data, UP data, and extra page (XP) data, respectively) are stored in data storage unit ($D_1$) 606, data storage unit ($D_2$) 606, data storage unit ($D_3$) 606, and BL storage unit 610, respectively.

It is noted from Tables 2 and 3 that only one storage unit (e.g., cache storage unit 608) is left in an idle state and can be used for the read operation during the suspension of the program operation. Since at least two storage units are needed to execute the read operation, one of the storage units occupied by the suspension of the program operation (e.g., sensing storage unit 612) needs to be released for the read operation as shown below in FIGS. 7B-7C.

FIG. 7B is a graphical representation illustrating an example of a remaining portion of suspended program information stored in page buffer circuit 602 during the execution of the read operation of FIG. 7A, according to some aspects of the present disclosure. Table 4 in FIG. 7B illustrates the remaining portion of the suspended program information with respect to the TLC memory device. Table 4 of FIG. 7B can be generated based on Table 2 of FIG. 7A.

In a first example, responsive to receiving a suspension command to suspend the program operation, control logic 512 may control page buffer circuit 602 to perform at least one of the following operations: (1) copying the UP data stored in BL storage unit 610 (as shown in Table 2) to cache storage unit 608; (2) sending the UP data from cache storage unit 608 to memory controller 106 for storage, so that the UP data can be stored in memory controller 106 and cache storage unit 608 is in an idle state again; or (3) copying the inhibit information from sensing storage unit 612 to BL storage unit 610, so that sensing storage unit 612 is in an idle state. In this case, the piece of program information selected to be stored in memory controller 106 is the UP data.

In a second example, memory controller 106 (e.g., suspension processing unit 628 of memory controller 106) may be configured to store the piece of program information (e.g., the UP data) in memory 622 or controller storage unit 624, regardless of whether the suspension of the program operation occurs or not. Then, responsive to receiving the suspension command to suspend the program operation, control logic 512 may control page buffer circuit 602 to copy the inhibit information from sensing storage unit 612 to BL storage unit 610, so that sensing storage unit 612 and cache storage unit 608 are in an idle state. In this case, there is no need to send the UP data to memory controller 106.

In either example, the remaining portion of the suspended program information stored in page buffer circuit 602 includes the inhibit information, the LP data, and the MP data, which can be stored in BL storage unit 610, data storage unit ($D_1$) 606, and data storage unit ($D_2$) 606, respectively, as shown in Table 4. When comparing the first and second examples described above, more communication bandwidth of memory controller 106 is consumed by the first example since the piece of program information needs to be sent from page buffer circuit 602 to memory controller 106 for storage. On the other hand, more storage resource of memory controller 106 is consumed by the second example since memory controller 106 stores the piece of program information regardless of whether the program operation is interrupted by the read operation or not. An application of the first or second example represents a tradeoff between the communication bandwidth and the storage resource in memory controller 106.

After the remaining portion of the suspended program information is stored in page buffer circuit 602, control logic 512 may initiate the read operation on second memory cell 306 using sensing storage unit 612 and cache storage unit 608. If the read operation is completed, memory controller 106 may send the piece of program information (e.g., the UP data) to cache storage unit 608 of page buffer circuit 602. Control logic 512 may control page buffer circuit 602 to perform at least one of the following operations to restore the suspended program information: (1) copying the inhibit information from BL storage unit 610 to sensing storage unit 612; or (2) copying the UP data from cache storage unit 608 to BL storage unit 610. Then, cache storage unit 608 is in an idle state again. The suspended program information is restored in page buffer circuit 602, as shown in Table 2 of FIG. 7A again. Then, control logic 512 may control page buffer circuit 602 to resume the program operation based on the suspended program information.

Table 5 in FIG. 7B illustrates the remaining portion of the suspended program information stored in page buffer circuit 602 during the execution of the read operation with respect to the QLC memory device. Table 5 of FIG. 7B can be generated based on Table 3 of FIG. 7A. For example, responsive to receiving the suspension command, control logic 512 may control page buffer circuit 602 to perform at least one of the following operations: (1) copying the XP data stored in BL storage unit 610 (as shown in Table 3) to cache storage unit 608; (2) sending the XP data from cache storage unit 608 to memory controller 106, so that the XP data can be stored in memory controller 106 and cache storage unit 608 is in an idle state; or (3) copying the inhibit information from sensing storage unit 612 to BL storage unit 610, so that sensing storage unit 612 is in an idle state. In this case, the piece of program information stored in memory controller 106 is the XP data.

In another example, memory controller 106 may store the piece of program information (e.g., the XP data) regardless of whether the suspension of the program operation occurs or not. Then, responsive to receiving the suspension command to suspend the program operation, control logic 512 may control page buffer circuit 602 to copy the inhibit information from sensing storage unit 612 to BL storage unit 610, so that sensing storage unit 612 and cache storage unit 608 are in an idle state. There is no need to send the XP data to memory controller 106.

In either example, the remaining portion of the suspended program information stored in page buffer circuit 602 includes the inhibit information, the LP data, the MP data, and the UP data, which can be stored in BL storage unit 610, data storage unit ($D_1$) 606, data storage unit ($D_2$) 606, and data storage unit ($D_3$) 606, respectively, as shown in Table 5. Sensing storage unit 612 and cache storage unit 608 are in an idle state.

Next, control logic 512 may initiate the read operation on second memory cell 306 using sensing storage unit 612 and cache storage unit 608. After the read operation is completed, memory controller 106 may send the piece of program information (e.g., the XP data) to cache storage unit 608 of page buffer circuit 602. Control logic 512 may control page buffer circuit 602 to perform at least one of the following operations to restore the suspended program information: (1) copying the inhibit information from BL storage unit 610 to sensing storage unit 612; or (2) copying the XP data from cache storage unit 608 to BL storage unit 610. Cache storage unit 608 is in an idle state again. Thus, the suspended program information is restored in page buffer circuit 602, as shown in Table 3 of FIG. 7A again. Control logic 512 may control page buffer circuit 602 to resume the program operation based on the suspended program information.

FIG. 7C is a graphical representation illustrating another example of a remaining portion of suspended program information stored in page buffer circuit 602 during the execution of the read operation of FIG. 7A, according to some aspects of the present disclosure. Table 6 in FIG. 7C illustrates the remaining portion of the suspended program information with respect to the TLC memory device. The piece of program information selected to be stored in memory controller 106 is the inhibit information. The remaining portion of the suspended program information stored in page buffer circuit 602 includes the UP data, the LP data, and the MP data, which are stored in BL storage unit 610, data storage unit ($D_1$) 606, and data storage unit ($D_2$) 606, respectively, as shown in Table 6.

In some implementations, Table 6 of FIG. 7C can be generated based on Table 2 of FIG. 7A. For example, responsive to receiving the suspension command to suspend the program operation, control logic 512 may control page buffer circuit 602 to perform at least one of the following operations: (1) copying the inhibit information from sensing storage unit 612 to cache storage unit 608, so that sensing storage unit 612 is in an idle state; or (2) sending the inhibit information from cache storage unit 608 to memory controller 106 for storage, so that cache storage unit 608 is in an idle state and the inhibit information can be stored in memory controller 106. Then, control logic 512 may initiate the read operation on second memory cell 306 using sensing storage unit 612 and cache storage unit 608 that are in an idle state. After the read operation is completed, memory controller 106 may send the piece of program information (e.g., the inhibit information) to cache storage unit 608 of page buffer circuit 602. Control logic 512 may control page buffer circuit 602 to copy the inhibit information from cache storage unit 608 to sensing storage unit 612 to restore the suspended program information, as shown in Table 2 of FIG. 7A again. Thus, control logic 512 may control page buffer circuit 602 to resume the program operation based on the suspended program information.

In some implementations, the suspended program information (including the inhibit information, the LP data, the MP data, and the UP data) are stored in sensing storage unit 612, data storage unit ($D_1$) 606, data storage unit ($D_2$) 606, and cache storage unit 608, respectively, which is different from Table 2 of FIG. 7A. In this case, BL storage unit 610 is in an idle state. Responsive to receiving the suspension command to suspend the program operation, control logic 512 may control page buffer circuit 602 to perform at least one of the following operations: (1) copying the UP data stored in cache data storage unit 608 to BL storage unit 610; (2) copying the inhibit information from sensing storage unit 612 to cache storage unit 608, so that sensing storage unit 612 is in an idle state; or (3) sending the inhibit information from cache storage unit 608 to memory controller 106 for storage, so that cache storage unit 608 is in an idle state and the inhibit information can be stored in memory controller 106. Then, control logic 512 may initiate the read operation on second memory cell 306 using sensing storage unit 612 and cache storage unit 608 that are in an idle state. After the read operation is completed, memory controller 106 may send the piece of program information (e.g., the inhibit information) to cache storage unit 608 of page buffer circuit 602. Control logic 512 may control page buffer circuit 602 to perform at least one of the following operations to restore the suspended program information: (1) copying the inhibit information from cache storage unit 608 to sensing storage unit 612; or (2) copying the UP data from BL storage unit 610 to cache storage unit 608. Thus, control logic 512 may control page buffer circuit 602 to resume the program operation based on the suspended program information.

Table 7 in FIG. 7C illustrates the remaining portion of the suspended program information stored in page buffer circuit 602 with respect to the QLC memory device. The remaining portion of the suspended program information includes the XP data, the LP data, the MP data, and the UP data, which are stored in BL storage unit 610, data storage unit ($D_1$) 606, data storage unit ($D_2$) 606, and data storage unit ($D_3$) 606 respectively, as shown in Table 7. The piece of program information selected to be stored in memory controller 106 is the inhibit information.

In some implementations, Table 7 of FIG. 7C can be generated based on Table 3 of FIG. 7A. For example, responsive to receiving the suspension command to suspend the program operation, control logic 512 may control page buffer circuit 602 to perform at least one of the following operations: (1) copying the inhibit information from sensing storage unit 612 to cache storage unit 608, so that sensing storage unit 612 is in an idle state; and (2) sending the inhibit information from cache storage unit 608 to memory controller 106, so that cache storage unit 608 is in an idle state and the inhibit information can be stored in memory controller 106. Then, control logic 512 may initiate the read operation on second memory cell 306 using sensing storage unit 612 and cache storage unit 608. After the read operation is completed, memory controller 106 may send the piece of program information (e.g., the inhibit information) to cache storage unit 608 of page buffer circuit 602. Control logic 512 may control page buffer circuit 602 to copy the inhibit information from cache storage unit 608 to sensing storage unit 612 to restore the suspended program information, as shown in Table 3 of FIG. 7A again. Thus, control logic 512 may control page buffer circuit 602 to resume the program operation based on the suspended program information.

In some implementations, the suspended program information (including the inhibit information, the LP data, the MP data, the UP data, and the XP data) are stored in sensing storage unit 612, data storage unit ($D_1$) 606, data storage unit ($D_2$) 606, data storage unit ($D_3$) 606, and cache storage unit 608, respectively, which is different from Table 3 of FIG. 7A. In this case, BL storage unit 610 is in an idle state. Responsive to receiving the suspension command to suspend the program operation, control logic 512 may control page buffer circuit 602 to perform at least one of the following operations: (1) copying the XP data stored in cache data storage unit 608 to BL storage unit 610; (2) copying the inhibit information from sensing storage unit 612 to cache storage unit 608, so that sensing storage unit 612 is in an idle state; and (3) sending the inhibit information from cache storage unit 608 to memory controller 106, so that cache storage unit 608 is in an idle state and the inhibit information can be stored in memory controller 106. Then, control logic 512 may initiate the read operation on second memory cell 306 using sensing storage unit 612 and cache storage unit 608. After the read operation is completed, memory controller 106 may send the piece of program information (e.g., the inhibit information) to cache storage unit 608 of page buffer circuit 602. Control logic 512 may control page buffer circuit 602 to perform at least one of the following operations to restore the suspended program information: (1) copying the inhibit information from cache storage unit 608 to sensing storage unit 612; or (2) copying the XP data from BL storage unit 610 to cache storage unit 608. Thus, control logic 512 may control page buffer circuit 602 to resume the program operation based on the suspended program information.

Figure 8:
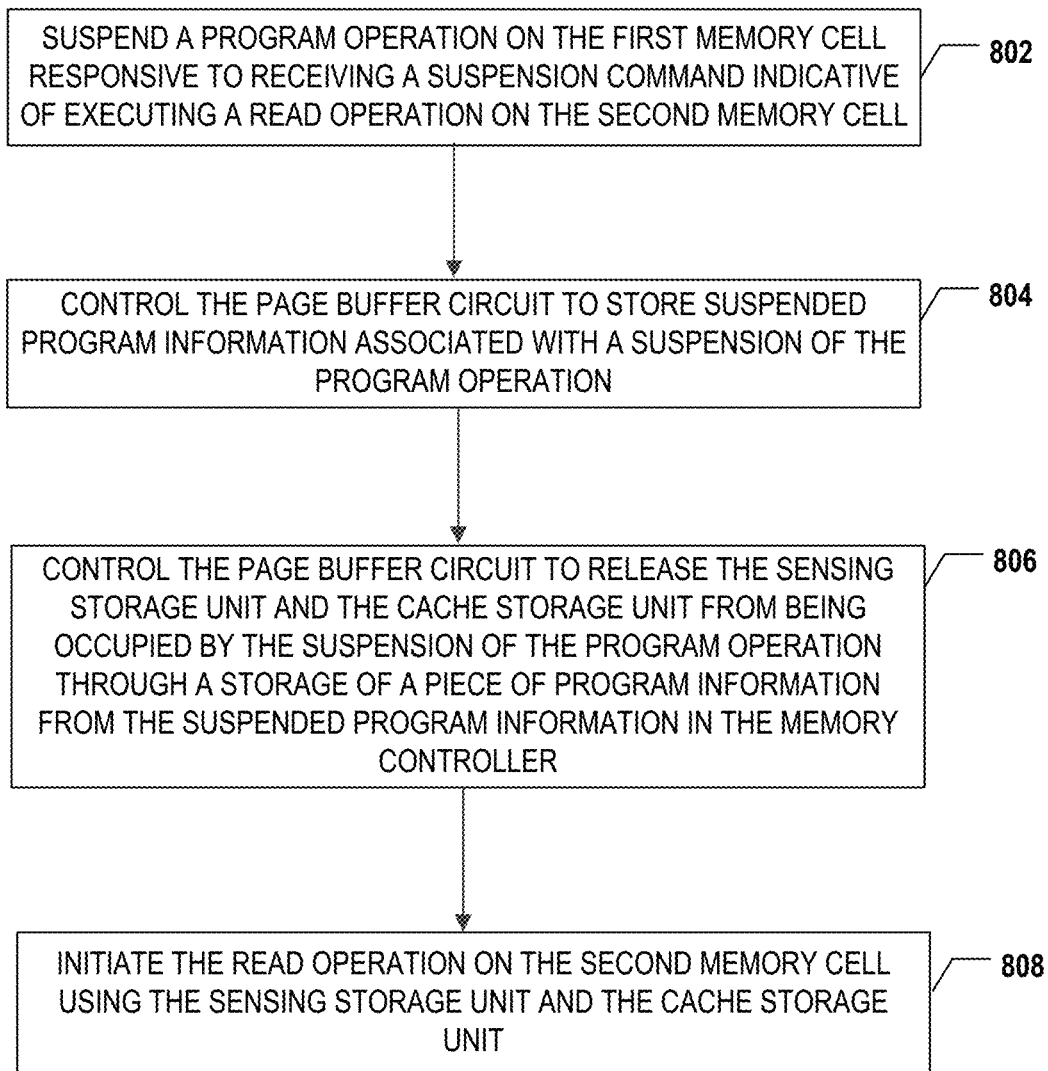
FIG. 8 illustrates a flowchart of an exemplary method for operating a memory device, according to some aspects of the present disclosure.

FIG. 8 illustrates a flowchart of an exemplary method 800 for operating a memory device, according to some aspects of the present disclosure. The memory device may be any suitable memory device disclosed herein, such as memory device 300. Method 800 may be implemented by peripheral circuits 302, such as control logic 512. It is understood that the operations shown in method 800 may not be exhaustive and that other operations can be performed as well before, after, or between any of the illustrated operations. Further, some of the operations may be performed simultaneously, or in a different order than shown in FIG. 8.

In some implementations, the memory device may include an array of memory cells 306 including, e.g., a first memory cell 306 and a second memory cell 306. First and second memory cells 306 can be in a NAND memory string 308 coupled to a page buffer circuit (e.g., page buffer circuit 602) in page buffer/sense amplifier 504.

Referring to FIG. 8, method 800 starts at operation 802, in which a program operation on first memory cell 306 is suspended responsive to receiving a suspension command indicative of executing a read operation on second memory cell 306. For example, control logic 512 may suspend the program operation on first memory cell 306 if the program operation is interrupted by the read operation on second memory cell 306.

Method 800 proceeds to operation 804, as illustrated in FIG. 8, in which page buffer circuit 602 is controlled to store suspended program information associated with a suspension of the program operation. For example, the program operation is configured to write a piece of N-bits data at one of $2^N$ levels to first memory cell 306, where the piece of N-bits data includes N portions of page data. Then, the suspended program information includes, for example, the N portions of page data and inhibit information associated with the program operation. Control logic 512 may control page buffer circuit 602 to store the N portions of page data and the inhibit information in N+1 storage units from sensing storage unit 612, BL storage unit 610, N−1 data storage units 606, and cache storage unit 608 of page buffer circuit 602, respectively.

Method 800 proceeds to operation 806, as illustrated in FIG. 8, in which page buffer circuit 602 is controlled to release sensing storage unit 612 and cache storage unit 608 from being occupied by the suspension of the program operation through a storage of a piece of program information from the suspended program information in memory controller 106. For example, control logic 512 may select one of the inhibit information and the N portions of page data as the piece of program information to be stored in memory controller 106. Control logic 512 may control page buffer circuit 602 to send the piece of program information to memory controller 106 for storage. Control logic 512 may control page buffer circuit 602 to store a remaining portion of the inhibit information and the N portions of page data in BL storage unit 610 and N−1 data storage units 606, respectively. In another example, control logic 512 may determine the piece of program information that is pre-stored in memory controller 106. Control logic 512 may control page buffer circuit 602 to store a remaining portion of the inhibit information and the N portions of page data in BL storage unit 610 and N−1 data storage units 606, respectively.

Method 800 proceeds to operation 808, as illustrated in FIG. 8, in which the read operation is initiated on second memory cell 306 using sensing storage unit 612 and cache storage unit 608. For example, control logic 512 may control page buffer circuit 602 to perform at least one of the following operations: (1) storing a read signal from second memory cell 306 in sensing storage unit 612; (2) sending the read signal from sensing storage unit 612 to cache storage unit 608; or (3) sending the read signal from cache storage unit 608 to an interface (e.g., interface 516) of the memory device.

FIG. 9 is a graphical representation illustrating an exemplary comparison of cache resource consumption in a memory controller (e.g., memory controller 106) between a destructive mode and a non-destructive mode, according to some aspects of the present disclosure. With respect to a column 902 of Table 8, when the destructive mode is applied in a memory device (e.g., memory device 300 or any other memory device disclosed herein), suspended program information associated with a program operation is not stored in the memory device. Thus, to support a program-operation suspension feature by the memory device, the suspended program information is needed to be stored in storage resources (e.g., cache resources) of memory controller 106. For example, for a TLC (or QLC) memory device, 3 (or 4) storage units from memory controller 106 are needed to store the suspended program information.

With respect to a column 904 of Table 8, when the non-destructive mode is applied in the memory device, suspended program information associated with the program operation is stored in the memory device. However, as described above, there will not be sufficient storage units available in the page buffer circuit to perform the read operation that interrupts the program operation. If no storage resource (e.g., no cache resource) in memory controller 106 is used to store at least part of the suspended program information, the program-operation suspension feature cannot be supported by the memory device. That is, the program-operation suspension feature cannot be supported by the memory device in the non-destructive mode without controller caching.

With respect to a column 906 of Table 8, when the non-destructive mode is applied in the memory device, at least part of the suspended program information associated with the program operation is stored in the memory device. By applying the techniques disclosed herein with reference to FIGS. 5A-8, a storage unit from memory controller 106 can be used to store a piece of program information from the suspended program information, so that sufficient storage units in the page buffer circuit can be released to perform the read operation that interrupts the program operation. For example, for the TLC or QLC memory device, 1 storage unit from memory controller 106 is needed to store the piece of program information. In this case, the program-operation suspension feature can be supported by the memory device in the non-destructive mode with controller caching.

It is noted from Table 8 that, to support the program-operation suspension feature in the non-destructive mode with controller caching (corresponding to column 906), the communication bandwidth of memory controller 106 may be impacted by the storage of the piece of program information in memory controller 106. However, fewer storage resources are needed to support the program-operation suspension feature when compared to the destructive mode (corresponding to column 902). The techniques disclosed herein with reference to FIGS. 5A-8 (corresponding to column 906) have no impact on a read time of the read operation (e.g., adding no delay to the read operation), and may provide a balance between the consumption of the storage resources in memory controller 106 and support of the program-operation suspension feature.

Figure 10:
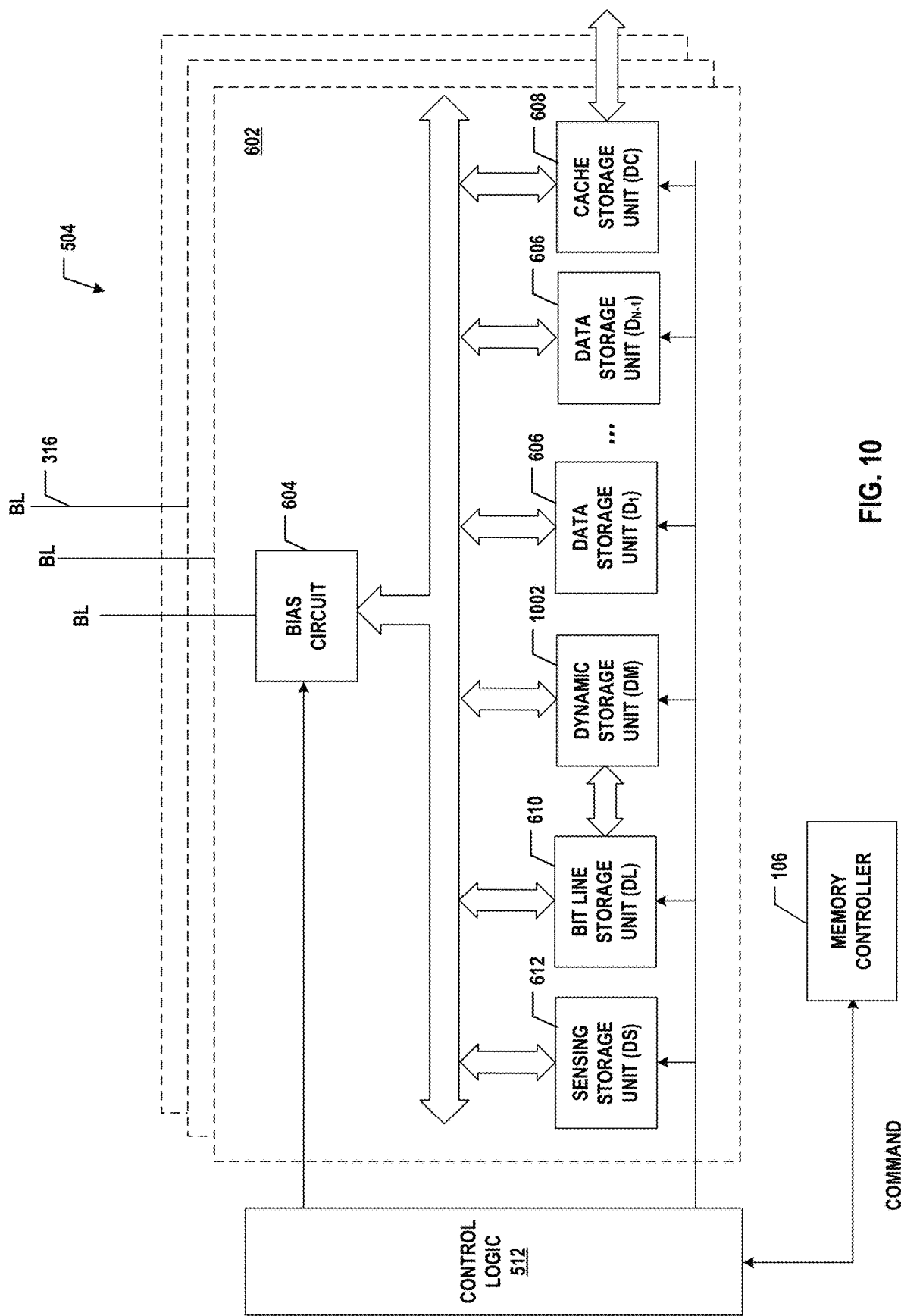
FIG. 10 illustrates a detailed block diagram of another exemplary structure of a page buffer, according to some aspects of the present disclosure.

FIG. 10 illustrates a detailed block diagram of another exemplary structure of a page buffer (e.g., page buffer/sense amplifier 504), according to some aspects of the present disclosure. The page buffer of FIG. 10 may include components like those described above for the page buffer of FIG. 6A, and the similar description will not be repeated here.

In some implementations, each page buffer circuit 602 in FIG. 10 may additionally include a dynamic storage unit (DM) 1002 that is coupled to BL storage unit (DL) 610. Different from other storage units 606, 608, 610, and 612, which can store data permanently (e.g., for an amount of time greater than a predetermined threshold), dynamic storage unit 1002 may have a limited amount of time to store data (e.g., 20 microseconds (µs) or another amount of time less than 40 µs). As a result, dynamic storage unit 1002 may need to be refreshed regularly so that the data stored in dynamic storage unit 1002 may not be lost. The refreshing of dynamic storage unit 1002 is described below in more detail.

Another exemplary process for initiating a read operation during a suspension of a program operation in a non-destructive mode is illustrated herein with reference to FIG. 10. Initially, control logic 512 may initiate the program operation on a first select row of memory cells 306 (including a first memory cell 306). If the read operation on a second select row of memory cells 306 (including a second memory cell 306) is initiated to interrupt the program operation, control logic 512 may receive a suspension command issued by memory controller 106. The suspension command may indicate to suspend the ongoing program operation on first select row of memory cells 306 (including first memory cell 306) and to initiate the read operation on second select row of memory cells 306 (including second memory cell 306). First and second memory cells 306 may be in a NAND memory string 308 coupled to the same page buffer circuit 602 through the same bit line 316. Then, control logic 512 can send control signals to various peripheral circuits, such as row decoder/word line driver 508, column decoder/bit line driver 506, and voltage generator 510, to suspend the program operation and initiate the read operation triggered by the suspension command.

Specifically, control logic 512 may be configured to suspend the program operation on first select row of memory cells 306 (including first memory cell 306) responsive to receiving the suspension command indicative of executing the read operation on second select row of memory cells 306 (including second memory cell 306). Control logic 512 may control page buffer circuit 602 to store suspended program information associated with the suspension of the program operation.

For example, the program operation may be configured to write a piece of N-bits data at one of 2 levels to first memory cell 306, where the piece of N-bits data includes N portions of page data (e.g., N bits from the current data page). The suspended program information may include N+1 pieces of program information (e.g., including inhibit information and the N portions of page data) associated with the program operation. Control logic 512 may control page buffer circuit 602 to store the N portions of page data and the inhibit information in N+1 storage units from sensing storage unit 612, BL storage unit 610, N−1 data storage units 606, and cache storage unit 608, respectively. Exemplary suspended program information stored in page buffer circuit 602 with respect to a QLC memory device is illustrated below in more detail with reference to FIG. 12A.

Next, control logic 512 may be configured to control page buffer circuit 602 to release sensing storage unit 612 and cache storage unit 608 from being occupied by the suspension of the program operation through usage of dynamic storage unit 1002 during the suspension of the program operation. For example, control logic 512 may control page buffer circuit 602 to store the suspended program information (e.g., including the inhibit information and the N portions of page data) in dynamic storage unit 1002, BL storage unit 610, and N−1 data storage units 606, respectively. Specifically, control logic 512 may control dynamic storage unit 1002 to store a first piece of program information from the suspended program information. Control logic 512 may control BL storage unit 610 to store a second piece of program information from the suspended program information. Control logic 512 may control N−1 data storage units 606 to store the remaining N−1 pieces of program information from the suspended program information, respectively. As a result, sensing storage unit 612 and cache storage unit 608 are released from being occupied by the suspension of the program operation. That is, sensing storage unit 612 and cache storage unit 608 are in an idle state.

In some implementations, control logic 512 may control dynamic storage unit 1002 and BL storage unit 610 to swap the first piece of program information and the second piece of program information in a predetermined time interval so that dynamic storage unit 1002 can be refreshed in the predetermined time interval. For example, the swapping of the first piece of program information and the second piece of program information between dynamic storage unit 1002 and BL storage unit 610 can be triggered by a logic signal generated by control logic 512. The swapping of the first and second pieces of program information is described below in more detail with reference to FIG. 11B.

Responsive to sensing storage unit 612 and cache storage unit 608 being released from being occupied by the suspension of the program operation, control logic 512 may be configured to initiate the read operation on second memory cell 306 using sensing storage unit 612 and cache storage unit 608. For example, control logic 512 may control sensing storage unit 612 to sense the data stored in second memory cell 306 and to generate a read signal correspondingly. Control logic 512 may control page buffer circuit 602 to store the read signal from second memory cell 306 in sensing storage unit 612. Control logic 512 may control page buffer circuit 602 to send the read signal from sensing storage unit 612 to cache storage unit 608. Control logic 512 may also control page buffer circuit 602 to send the read signal from cache storage unit 608 to interface 516 of memory device 300.

When the read operation on second memory cell 306 completes, control logic 512 may be further configured to control page buffer circuit 602 to restore the suspended program operation. For example, control logic 512 may control page buffer circuit 602 to re-save the N portions of page data and the inhibit information in the N+1 storage units from sensing storage unit 612, BL storage unit 610, N−1 data storage units 606, and cache storage unit 608, respectively. Control logic 512 may control page buffer circuit 602 to resume the program operation on first memory cell 306 using the suspended program information.

Figure 11A:
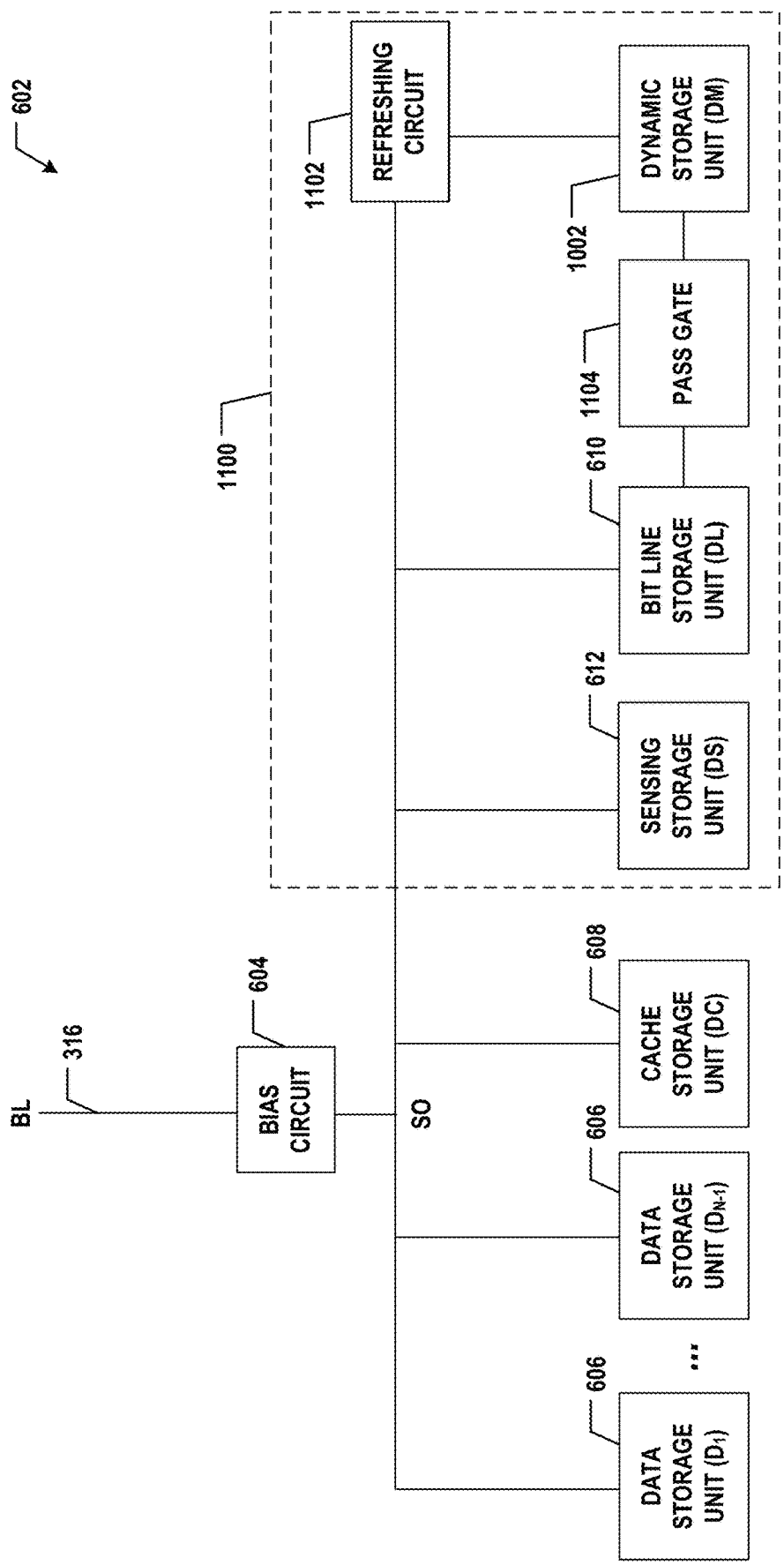
FIG. 11A illustrates a detailed block diagram of another exemplary structure of a page buffer circuit, according to some aspects of the present disclosure.

FIG. 11A illustrates a detailed block diagram of an exemplary structure of a page buffer circuit (e.g., page buffer circuit 602), according to some aspects of the present disclosure. In FIG. 11A, an output of bias circuit 604 is coupled to a sense out (SO) node. N−1 data storage units 606, cache storage unit 608, sensing storage unit 612, and BL storage unit 610 are coupled to the SO node, respectively. Page buffer circuit 602 of FIG. 11A includes a refreshing circuit 1102 configured to refresh dynamic storage unit 1002 under the control of control logic 512. BL storage unit 610 is coupled to dynamic storage unit 1002 via a pass gate 1104. A portion 1100 of page buffer circuit 602 in FIG. 11A (including sensing storage unit 612, BL storage unit 610, pass gate 1104, dynamic storage unit 1002, and refreshing circuit 1102) is illustrated below in more detail with reference to FIG. 11B.

Figure 11B:
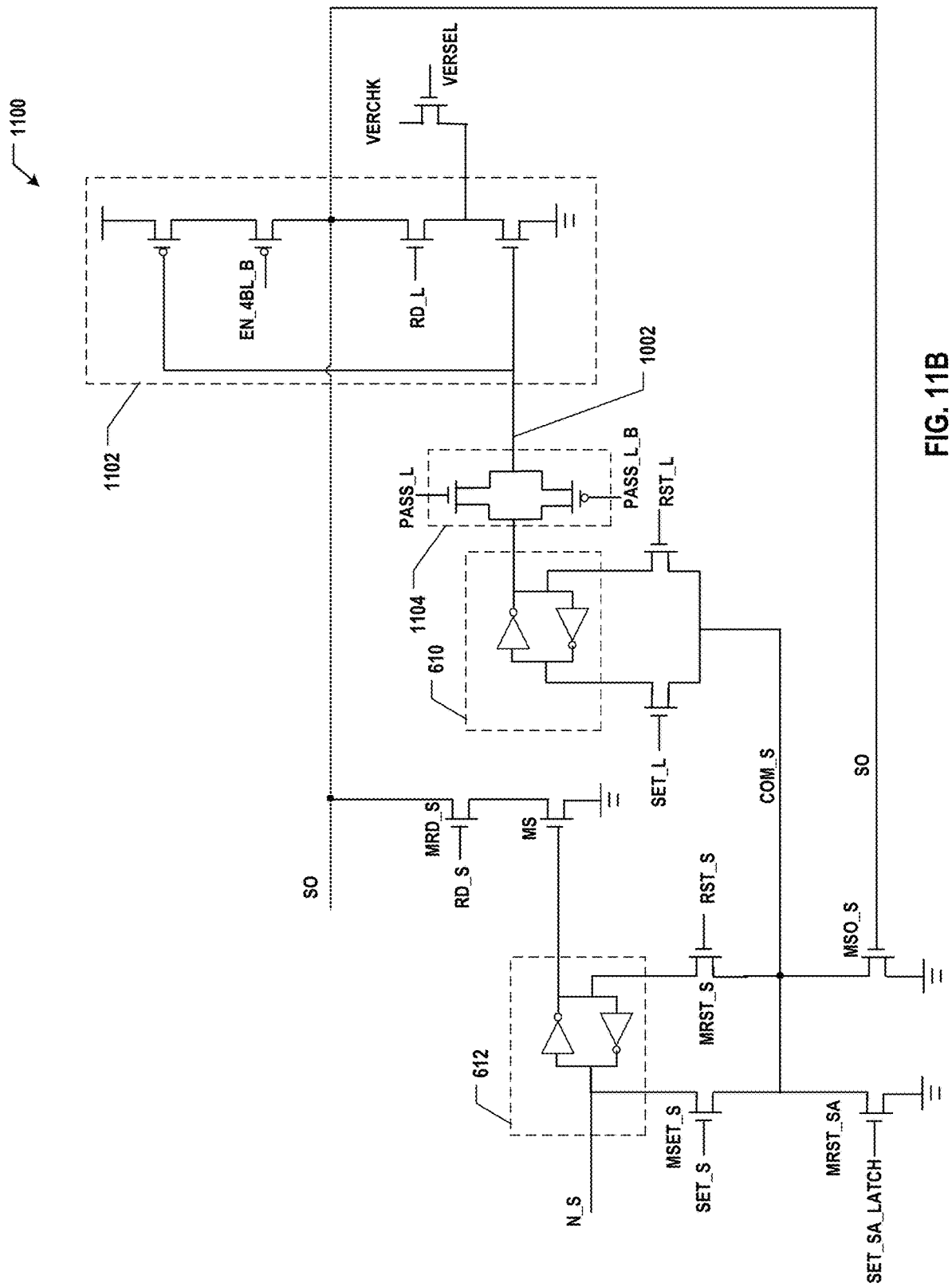
FIG. 11B illustrates a circuit diagram of a portion of the page buffer circuit in FIG. 11A, according to some aspects of the present disclosure.

FIG. 11B illustrates a circuit diagram of a portion (e.g., portion 1100) of page buffer circuit 602 in FIG. 11A, according to some aspects of the present disclosure. Exemplary circuit structures of sensing storage unit 612, BL storage unit (DL) 610, pass gate 1104, dynamic storage unit (DM) 1002, and refreshing circuit 1102 are illustrated in FIG. 11B. BL storage unit (DL) 610 and dynamic storage unit (DM) 1002 are coupled to each other through pass gate 1104. Pass gate 1104 may include a first transistor controlled by a signal PASS_L and a second transistor controlled by a signal PASS_L_B, where the first and second transistors are connected in parallel. Dynamic storage unit (DM) 1002 may include a connection line that connects pass gate 1104 to refreshing circuit 1102. A voltage level (or, a current level, a potential level) of the connection line can be configured to represent a first or second piece of program information stored in dynamic storage unit (DM) 1002.

As described above, dynamic storage unit (DM) 1002 and BL storage unit (DL) 610 may store the first piece of program information and the second piece of program information, respectively. To control dynamic storage unit (DM) 1002 and BL storage unit (DL) 610 to swap the first and second pieces of program information, control logic 512 may control page buffer circuit 602 to perform an information-swapping process through the SO node. For example, the information-swapping process may include at least one of the following operations: (1) toggling signals RD_L and EN_4BL_B that are applied to refreshing circuit 1102, so that the first piece of program information stored in dynamic storage unit (DM) 1002 is transferred to the SO node (e.g., SO=DM); (2) toggling the signal PASS_L so that pass gate 1104 is turned on and the second piece of program information stored in BL storage unit (DL) 610 is transferred to dynamic storage unit (DM) 1002 (e.g., DM=DL); (3) setting signals SET_L and RST_SA_LATCH so that BL storage unit (DL) 610 is configured to have a value of "1" (e.g., DL="1"); or (4) setting a signal RST_L so that the first piece of program information stored in the SO node is transferred to BL storage unit (DL) 610 (e.g., DL=SO). As a result, the information-swapping process to swap the first and second pieces of program information between dynamic storage unit (DM) 1002 and BL storage unit (DL) 610 is completed. This information-swapping process may take, for example, about 400 nanoseconds (ns). Each time when the first and second pieces of program information are swapped between dynamic storage unit (DM) 1002 and BL storage unit (DL) 610, dynamic storage unit (DM) 1002 can be refreshed once. As a result, even though dynamic storage unit (DM) 1002 can only store data for a limited amount of time as described above, dynamic storage unit (DM) 1002 can be used to store the first or second piece of program information due to the information-swapping process.

FIG. 12A is a graphical representation illustrating exemplary suspended program information stored in a page buffer circuit (e.g., page buffer circuit 602 of FIG. 10, 11A or 11B) before an execution of a read operation with respect to a QLC memory device, according to some aspects of the present disclosure. The suspended program information is associated with a program operation on a first memory cell 306, where the program operation is interrupted by the read operation on a second memory cell 306. Both first and second select memory cells 306 are in a NAND memory string 308 coupled to page buffer circuit 602 through the same bit line 316.

In Table 9, the program operation is configured to program a piece of 4-bits data at one of 16 levels to first memory cell 306, where the piece of 4-bits data includes 4 portions of page data (e.g., 4 bits from a current data page). By way of examples, inhibit information associated with the program operation is stored in BL storage unit 610, and the 4 portions of page data (e.g., LP data, MP data, UP data, and XP data) are stored in data storage unit ($D_1$) 606, data storage unit ($D_2$) 606, data storage unit ($D_3$) 606, and cache storage unit 608, respectively. It is noted in Table 9 that sensing storage unit 612 is left in an idle state and can be used for the read operation during the suspension of the program operation. However, cache storage unit 608 is occupied by the suspension of the program operation. Thus, cache storage unit 608 needs to be released for the read operation as shown below in FIG. 12B.

FIG. 12B is a graphical representation illustrating the suspended program information stored in page buffer circuit 602 during the execution of the read operation of FIG. 12A, according to some aspects of the present disclosure. Table 10 illustrates the suspended program information stored in page buffer circuit 602 and can be generated based on Table 9 of FIG. 12A. Specifically, responsive to receiving a suspension command to suspend the program operation, control logic 512 may control page buffer circuit 602 to perform at least one of the following operations: (1) copying the inhibit information stored in BL storage unit 610 (as shown in Table 9) to dynamic storage unit 1002; or (2) copying the XP data stored in cache storage unit 608 to BL storage unit 610, so that cache storage unit 608 is in an idle state. Then, control logic 512 may initiate the read operation on second memory cell 306 using sensing storage unit 612 and cache storage unit 608 that are in an idle state. During the execution of the read operation (e.g., during the suspension of the program operation), the inhibit information and the XP data may be swapped between dynamic storage unit 1002 and BL storage unit 610 to refresh dynamic storage unit 1002.

After the read operation is completed, control logic 512 may control page buffer circuit 602 to perform at least one of the following operations to restore the suspended program information: (1) copying the XP data from BL storage unit 610 (or dynamic storage unit 1002) to cache storage unit 608; or (2) if the inhibit information is stored in dynamic storage unit 1002, copying the inhibit information from dynamic storage unit 1002 to BL storage unit 610. As a result, the suspended program information is restored in page buffer circuit 602, as shown in Table 9 of FIG. 12A again. Then, control logic 512 may control page buffer circuit 602 to resume the program operation based on the suspended program information.

Figure 13:
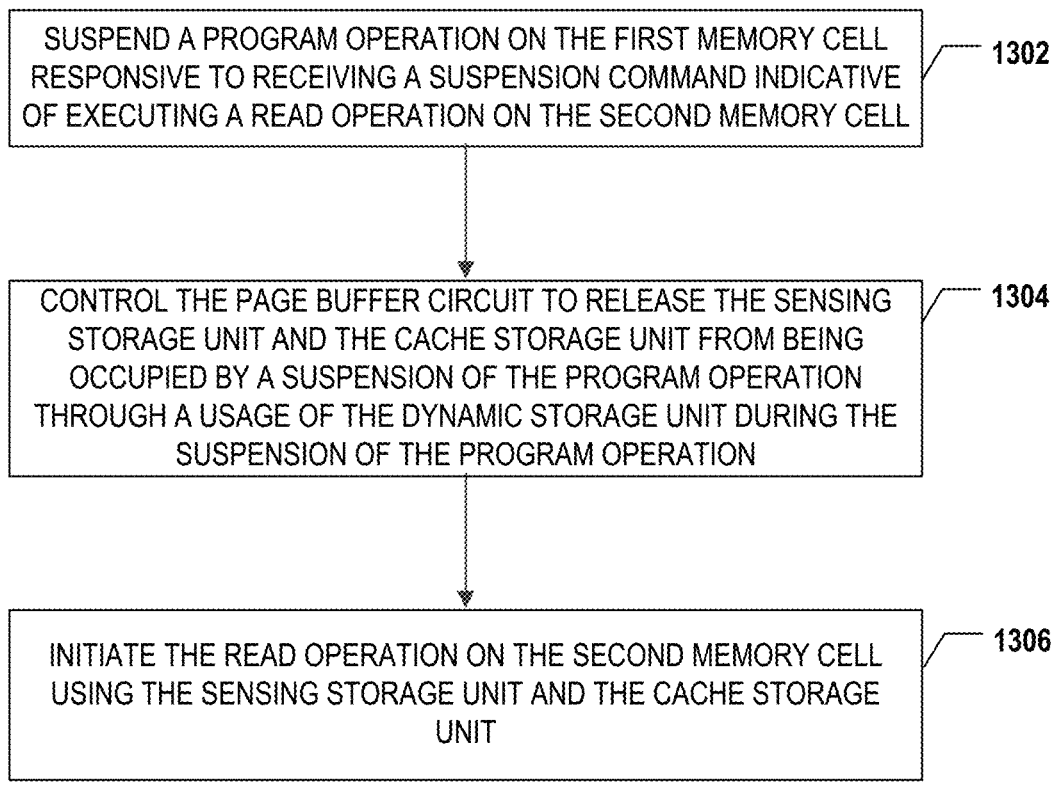
FIG. 13 illustrates a flowchart of another exemplary method for operating a memory device, according to some aspects of the present disclosure.

FIG. 13 illustrates a flowchart of another exemplary method 1300 for operating a memory device, according to some aspects of the present disclosure. The memory device may be any suitable memory device disclosed herein, such as memory device 300. Method 1300 may be implemented by peripheral circuits 302, such as control logic 512. It is understood that the operations shown in method 1300 may not be exhaustive and that other operations can be performed as well before, after, or between any of the illustrated operations. Further, some of the operations may be performed simultaneously, or in a different order than shown in FIG. 13.

In some implementations, the memory device may include an array of memory cells 306 including, e.g., a first memory cell 306 and a second memory cell 306. First and second memory cells 306 are in a NAND memory string 308 coupled to a page buffer circuit 602 in page buffer/sense amplifier 504. Page buffer circuit 602 may include sensing storage unit 612, cache storage unit 608, and dynamic storage unit 1002.

Referring to FIG. 13, method 1300 starts at operation 1302, in which a program operation on first memory cell 306 is suspended responsive to receiving a suspension command indicative of executing a read operation on second memory cell 306. Specifically, control logic 512 may suspend the program operation on first memory cell 306 if the program operation is interrupted by the read operation. Control logic 512 may control page buffer circuit 602 to store suspended program information associated with the program operation.

For example, the program operation may be configured to write a piece of N-bits data at one of $2^N$ levels to first memory cell 306, where the piece of N-bits data may include N portions of page data. The suspended program information may include the N portions of page data and inhibit information associated with the program operation. Control logic 512 may control page buffer circuit 602 to store the N portions of page data and the inhibit information in N+1 storage units from sensing storage unit 612, BL storage unit 610, N−1 data storage units 606, and cache storage unit 608 of page buffer circuit 602, respectively.

Method 1300 proceeds to operation 1304, as illustrated in FIG. 13, in which page buffer circuit 602 is controlled to release sensing storage unit 612 and cache storage unit 608 from being occupied by a suspension of the program operation through a usage of dynamic storage unit 1002 during the suspension of the program operation. For example, control logic 512 may control page buffer circuit 602 to store the suspended program information (including the inhibit information and the N portions of page data) in dynamic storage unit 1002, BL storage unit 610, and N−1 data storage units 606, respectively, so that sensing storage unit 612 and cache storage unit 608 are in an idle state.

In some implementations, dynamic storage unit 1002 may be configured to store a first piece of program information from the suspended program information. BL storage unit 610 may be configured to store a second piece of program information from the suspended program information. Dynamic storage unit 1002 and BL storage unit 610 may be configured to swap the first piece of program information and the second piece of program information in a predetermined time interval so that dynamic storage unit 1002 may be refreshed in the predetermined time interval.

Method 1300 proceeds to operation 1306, as illustrated in FIG. 13, in which the read operation is initiated on second memory cell 306 using sensing storage unit 612 and cache storage unit 608. For example, control logic 512 may control page buffer circuit 602 to store a read signal from second memory cell 306 in sensing storage unit 612. Control logic 512 may control page buffer circuit 602 to send the read signal from sensing storage unit 612 to cache storage unit 608. Control logic 512 may control page buffer circuit 602 to send the read signal from cache storage unit 608 to interface 516 of the memory device.

With combined reference to FIGS. 10-13, it is noted that to release sensing storage unit 612 and cache storage unit 608 from being occupied by the suspension of the program operation, dynamic storage unit 1002 may be used to store a piece of program information during the suspension of the program operation. In this case, the information-swapping process described above may be performed to swap the information stored in dynamic storage unit 1002 and BL storage unit 610 in a predetermined time interval so that dynamic storage unit 1002 can be refreshed in the predetermined time interval. Each time the information-swapping process is performed, it may cost about 400 ns to complete the information-swapping process, which may have an impact on the read time of the read operation (e.g., the read operation may have a longer read time due to the information-swapping process). However, the read operation can still be executed as a normal read operation (e.g., like a read operation without the suspension of the program operation). A failed bit count (FBC) of the read operation is not affected by the usage of dynamic storage unit 1002 even though the read operation is executed during the suspension of the program operation (e.g., the FBC of the read operation can be like that of the normal read operation).

Figure 14:
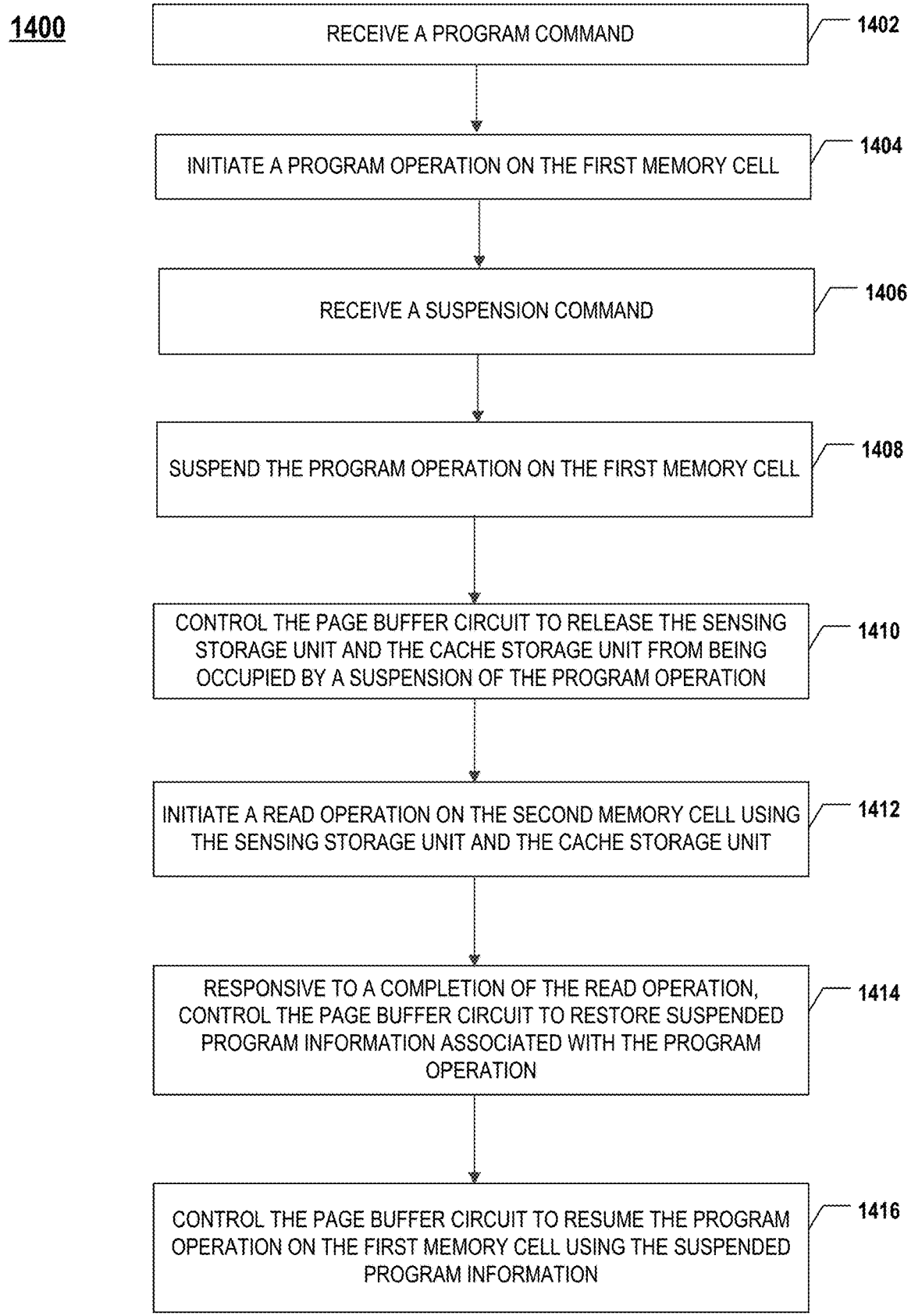
FIG. 14 illustrates a flowchart of still another exemplary method for operating a memory device, according to some aspects of the present disclosure.

FIG. 14 illustrates a flowchart of still another exemplary method 1400 for operating a memory device, according to some aspects of the present disclosure. The memory device may be any suitable memory device disclosed herein, such as memory device 300. Method 1400 may be implemented by peripheral circuits 302, such as control logic 512. It is understood that the operations shown in method 1400 may not be exhaustive and that other operations can be performed as well before, after, or between any of the illustrated operations. Further, some of the operations may be performed simultaneously, or in a different order than shown in FIG. 14.

In some implementations, the memory device may include an array of memory cells 306 including, e.g., a first memory cell 306 and a second memory cell 306. First and second memory cells 306 are from a NAND memory string 308 coupled to a page buffer circuit 602 in page buffer/sense amplifier 504.

Referring to FIG. 14, method 1400 starts at operation 1402, in which a program command is received. For example, control logic 512 may receive a program command indicative of executing a program operation on first memory cell 306.

Method 1400 proceeds to operation 1404, as illustrated in FIG. 14, in which the program operation is initiated on first memory cell 306. For example, control logic 512 can initiate the program operation on first memory cell 306.

In some implementations, control logic 512 receives the program command from memory controller 106 through interface 516, and in response, sends control signals to at least row decoder/word line driver 508, column decoder/bit line driver 506, and voltage generator 510 to initiate the program operation on first memory cell 306 coupled to select word line 318. Depending on the number of states to be programmed (i.e., the number of bits in each memory cell 306, e.g., SLC, MLC, TLC, QLC, etc.), one or more program passes can be performed. In each program pass, one or more program/verify cycles (e.g., N−1, N, N+1, N+2, . . . ) can be included in the program operation in sequence. During the program operation, in any program/verify cycle, a program voltage (i.e., a voltage pulse signal including one or more program pulses, e.g., Vpgm_n−1, Vpgm_n, Vpgm_n+1, and Vpgm_n+2) is applied to select word line 318 by word line driver 508 to program first memory cell 306 coupled to select word line 318.

Method 1400 proceeds to operation 1406, as illustrated in FIG. 14, in which a suspension command is received. For example, control logic 512 may receive the suspension command indicating that the program operation on first memory cell 306 is interrupted by a read operation on second memory cell 306.

Method 1400 proceeds to operation 1408, as illustrated in FIG. 14, in which the program operation on first memory cell 306 is suspended. For example, control logic 512 may suspend the program operation responsive to receiving the suspension command.

In some implementations, control logic 512 can be configured to receive a suspension command, for example, from memory controller 106 during the program operation. The suspension command is issued by memory controller 106 when an interrupt occurs, according to some implementations. The interrupt can be any request by a host (e.g., host 108 in FIG. 1) that needs to interrupt the ongoing program operation performed by memory device 300, so that the event can be processed in a timely manner. For example, a read operation may need to be performed on page 320 of memory cell array 301 immediately before the completion of the currently performed program operation. In some implementations, the interrupt occurs while applying a program pulse on select word line 318. It is also understood that the interrupt (and the receipt of the suspension command) may occur in any program/verify cycle (including the first cycle, the last cycle, or any intermediate cycles) or in a single program/verify cycle. It is further understood that the number of the interrupt events and the resulting suspension commands may vary during different program operations, for example, from 0 (i.e., a normal program operation) to the same number as the program pulses. In response to receiving a suspension command, peripheral circuits 302 can be configured to suspend the ongoing program operation. In some implementations, control logic 512 is configured to store suspended program information associated with the program operation in page buffer circuit 602.

Method 1400 proceeds to operation 1410, as illustrated in FIG. 14, in which page buffer circuit 602 is controlled to release sensing storage unit 612 and cache storage unit 608 from being occupied by a suspension of the program operation. For example, as illustrated in FIGS. 6A-9, control logic 512 may control page buffer circuit 602 to release sensing storage unit 612 and cache storage unit 608 from being occupied by the suspension of the program operation through a storage of a piece of program information in memory controller 106. The piece of program information is one of N+1 pieces of program information from the suspended program information. In another example, as illustrated in FIGS. 10-13, control logic 512 may control page buffer circuit 602 to release sensing storage unit 612 and cache storage unit 608 from being occupied by the suspension of the program operation through a usage of dynamic storage unit 1002 during the suspension of the program operation.

Method 1400 proceeds to operation 1412, as illustrated in FIG. 14, in which the read operation is initiated on second memory cell 306 using sensing storage unit 612 and cache storage unit 608. For example, control logic 512 can send control signals to other peripheral circuits 302 to perform the read operation, for example, row decoder/word line driver 508, column decoder/bit line driver 506, and voltage generator 510 to perform the read operation on second memory cell 306.

Method 1400 proceeds to operation 1414, as illustrated in FIG. 14, in which responsive to a completion of the read operation, page buffer circuit 602 is controlled to restore suspended program information associated with the program operation.

Method 1400 proceeds to operation 1416, as illustrated in FIG. 14, in which page buffer circuit 602 is controlled to resume the program operation on first memory cell 306 using the suspended program information.

For example, in response to the completion of the read operation, peripheral circuits 302 including control logic 512 can be configured to resume the suspended program operation. In some implementations, control logic 512 is further configured to recover the suspended program information in page buffer circuit 602 and send control signals to at least row decoder/word line driver 508, column decoder/bit line driver 506, and voltage generator 510 to resume the suspended program operation based on the suspended program information, according to some implementations.

According to one aspect of the present disclosure, a memory device includes an array of memory cells and a peripheral circuit coupled to the array of memory cells. The array of memory cells includes a first memory cell and a second memory cell. The peripheral circuit includes a page buffer and control logic. The page buffer includes at least a page buffer circuit that is coupled to the first and second memory cells, respectively. The page buffer circuit includes a sensing storage unit and a cache storage unit. The control logic is coupled to the page buffer and configured to suspend a program operation on the first memory cell responsive to receiving a suspension command indicative of executing a read operation on the second memory cell, control the page buffer circuit to store suspended program information associated with a suspension of the program operation, control the page buffer circuit to release the sensing storage unit and the cache storage unit from being occupied by the suspension of the program operation through a storage of a piece of program information from the suspended program information in a memory controller, and initiate the read operation on the second memory cell using the sensing storage unit and the cache storage unit.

In some implementations, the control logic is further configured to, responsive to a completion of the read operation, control the page buffer circuit to restore the suspended program operation based on the piece of program information received from the memory controller, and control the page buffer circuit to resume the program operation on the first memory cell using the suspended program information.

In some implementations, the program operation is configured to write a piece of N-bits data at one of $2^N$ levels to the first memory cell, where the piece of N-bits data includes N portions of page data, and N is an integer greater than 1. The suspended program information includes the N portions of page data and inhibit information associated with the program operation.

In some implementations, the page buffer circuit further includes a bit line storage unit and N−1 data storage units. To control the page buffer circuit to store the suspended program information, the control logic is configured to control the page buffer circuit to store the N portions of page data and the inhibit information in N+1 storage units from the sensing storage unit, the bit line storage unit, the N−1 data storage units, and the cache storage unit, respectively.

In some implementations, to control the page buffer circuit to release the sensing storage unit and the cache storage unit from being occupied by the suspension of the program operation through the storage of the piece of program information in the memory controller, the control logic is configured to select one of the inhibit information and the N portions of page data as the piece of program information to be stored in the memory controller, control the page buffer circuit to send the piece of program information to the memory controller for storage, and control the page buffer circuit to store a remaining portion of the inhibit information and the N portions of page data in the bit line storage unit and the N−1 data storage units, respectively.

In some implementations, to control the page buffer circuit to release the sensing storage unit and the cache storage unit from being occupied by the suspension of the program operation through the storage of the piece of program information in the memory controller, the control logic is configured to determine the piece of program information that is pre-stored in the memory controller. The piece of program information includes one of the inhibit information and the N portions of page data. The control logic is also configured to control the page buffer circuit to store a remaining portion of the inhibit information and the N portions of page data in the bit line storage unit and the N−1 data storage units, respectively.

In some implementations, the piece of program information includes one of the N portions of page data. To control the page buffer circuit to store the remaining portion of the inhibit information and the N portions of page data in the bit line storage unit and the N−1 data storage units, respectively, the control logic is configured to control the page buffer circuit to store the inhibit information in the bit line storage unit, and control the page buffer circuit to store N−1 remaining portions of page data in the N−1 data storage units, respectively.

In some implementations, the piece of program information includes the inhibit information. To control the page buffer circuit to store the remaining portion of the inhibit information and the N portions of page data in the bit line storage unit and the N−1 data storage units, respectively, the control logic is further configured to control the page buffer circuit to store the N portions of page data in the bit line storage unit and the N−1 data storage units, respectively.

In some implementations, to control the page buffer circuit to restore the suspended program information responsive to the completion of the read operation, the control logic is configured to control the page buffer circuit to receive the piece of program information from the memory controller to recover the inhibit information and the N portions of page data in the page buffer circuit, and control the page buffer circuit to re-save the N portions of page data and the inhibit information in the N+1 storage units from the sensing storage unit, the bit line storage unit, the N−1 data storage units, and the cache storage unit, respectively.

In some implementations, the sensing storage unit is coupled to the second memory cell. The cache storage unit is coupled to the sensing storage unit and an interface of the memory device. To initiate the read operation on the second memory cell, the control logic is configured to control the page buffer circuit to store a read signal from the second memory cell in the sensing storage unit, control the page buffer circuit to send the read signal from the sensing storage unit to the cache storage unit, and control the page buffer circuit to send the read signal from the cache storage unit to the interface of the memory device.

In some implementations, the first and second memory cells are in a three-dimensional (3D) NAND memory string.

According to another aspect of the present disclosure, a system includes a memory device configured to store data and a memory controller coupled to the memory device. The memory device includes an array of memory cells and a peripheral circuit coupled to the array of memory cells. The array of memory cells includes a first memory cell and a second memory cell. The peripheral circuit includes a page buffer and control logic coupled to the page buffer. The page buffer includes at least a page buffer circuit that is coupled to the first and second memory cells, respectively. The page buffer circuit includes a sensing storage unit and a cache storage unit. The control logic is configured to suspend a program operation on the first memory cell responsive to receiving a suspension command indicative of executing a read operation on the second memory cell, control the page buffer circuit to store suspended program information associated with a suspension of the program operation, and control the page buffer circuit to release the sensing storage unit and the cache storage unit from being occupied by the suspension of the program operation for the read operation on the second memory cell. The memory controller is configured to store a piece of program information from the suspended program information so that the sensing storage unit and the cache storage unit are released from being occupied by the suspension of the program operation.

In some implementations, responsive to a completion of the read operation, the memory controller is further configured to send the piece of program information to the page buffer circuit. The control logic is further configured to control the page buffer circuit to restore the suspended program operation based on the piece of program information received from the memory controller, and control the page buffer circuit to resume the program operation on the first memory cell using the suspended program information.

In some implementations, the program operation is configured to write a piece of N-bits data at one of $2^N$ levels to the first memory cell, where the piece of N-bits data includes N portions of page data, and N is an integer greater than 1. The suspended program information includes the N portions of page data and inhibit information associated with the program operation.

In some implementations, the page buffer circuit further includes a bit line storage unit and N−1 data storage units. To control the page buffer circuit to store the suspended program information, the control logic is configured to control the page buffer circuit to store the N portions of page data and the inhibit information in N+1 storage units from the sensing storage unit, the bit line storage unit, the N−1 data storage units, and the cache storage unit, respectively.

In some implementations, to control the page buffer circuit to release the sensing storage unit and the cache storage unit from being occupied by the suspension of the program operation for the read operation on the second memory cell, the control logic is configured to control the page buffer circuit to release the sensing storage unit and the cache storage unit from being occupied by the suspension of the program operation through a storage of the piece of program information on the memory controller.

In some implementations, the control logic is further configured to initiate the read operation on the second memory cell using the sensing storage unit and the cache storage unit.

In some implementations, to control the page buffer circuit to release the sensing storage unit and the cache storage unit from being occupied by the suspension of the program operation through the storage of the piece of program information on the memory controller, the control logic is configured to select one of the inhibit information and the N portions of page data as the piece of program information to be stored in the memory controller, control the page buffer circuit to send the piece of program information to the memory controller for storage, and control the page buffer circuit to store a remaining portion of the inhibit information and the N portions of page data in the bit line storage unit and the N−1 data storage units, respectively.

In some implementations, the memory controller is configured to pre-store the piece of program information before the suspension of the program operation.

In some implementations, to control the page buffer circuit to release the sensing storage unit and the cache storage unit from being occupied by the suspension of the program operation through the storage of the piece of program information in the memory controller, the control logic is configured to determine the piece of program information prestored in the memory controller, where the piece of program information includes one of the inhibit information and the N portions of page data, and control the page buffer circuit to store a remaining portion of the inhibit information and the N portions of page data in the bit line storage unit and the N−1 data storage units, respectively.

In some implementations, the piece of program information includes one of the N portions of page data. To control the page buffer circuit to store the remaining portion of the inhibit information and the N portions of page data in the bit line storage unit and the N−1 data storage units, respectively, the control logic is configured to control the page buffer circuit to store the inhibit information in the bit line storage unit, and control the page buffer circuit to store N−1 remaining portions of page data in the N−1 data storage units, respectively.

In some implementations, the piece of program information includes the inhibit information. To control the page buffer circuit to store the remaining portion of the inhibit information and the N portions of page data in the bit line storage unit and the N−1 data storage units, respectively, the control logic is further configured to control the page buffer circuit to store the N portions of page data in the bit line storage unit and the N−1 data storage units, respectively.

In some implementations, to control the page buffer circuit to restore the suspended program information, the control logic is configured to control the page buffer circuit to receive the piece of program information from the memory controller to recover the inhibit information and the N portions of page data in the page buffer circuit, and control the page buffer circuit to re-save the N portions of page data and the inhibit information in the N+1 storage units from the sensing storage unit, the bit line storage unit, the N−1 data storage units, and the cache storage unit, respectively.

In some implementations, the sensing storage unit is coupled to the second memory cell. The cache storage unit is coupled to the sensing storage unit and an interface of the memory device. To initiate the read operation on the second memory cell, the control logic is configured to control the page buffer circuit to store a read signal from the second memory cell in the sensing storage unit, control the page buffer circuit to send the read signal from the sensing storage unit to the cache storage unit, and control the page buffer circuit to send the read signal from the cache storage unit to the interface of the memory device.

In some implementations, the first and second memory cells are in a 3D NAND memory string.

According to still another aspect of the present disclosure, a method for operating a memory device including an array of memory cells is provided. The array of memory cells includes a first memory cell and a second memory cell that are coupled to a page buffer circuit in a page buffer. The page buffer circuit includes a sensing storage unit and a cache storage unit. A program operation on the first memory cell is suspended responsive to receiving a suspension command indicative of executing a read operation on the second memory cell. The page buffer circuit is controlled to store suspended program information associated with a suspension of the program operation. The page buffer circuit is controlled to release the sensing storage unit and the cache storage unit from being occupied by the suspension of the program operation through a storage of a piece of program information from the suspended program information in a memory controller. The read operation on the second memory cell is initiated using the sensing storage unit and the cache storage unit.

In some implementations, responsive to a completion of the read operation, the page buffer circuit is controlled to restore the suspended program information based on the piece of program information received from the memory controller. The page buffer circuit is controlled to resume the program operation on the first memory cell using the suspended program information.

In some implementations, the program operation is configured to write a piece of N-bits data at one of $2^N$ levels to the first memory cell, where the piece of N-bits data includes N portions of page data, and N is an integer greater than 1. The suspended program information includes the N portions of page data and inhibit information associated with the program operation.

In some implementations, the page buffer circuit further includes a bit line storage unit and N−1 data storage units. Controlling the page buffer circuit to store the suspended program information includes controlling the page buffer circuit to store the N portions of page data and the inhibit information in N+1 storage units from the sensing storage unit, the bit line storage unit, the N−1 data storage units, and the cache storage unit, respectively.

In some implementations, controlling the page buffer circuit to release the sensing storage unit and the cache storage unit from being occupied by the suspension of the program operation through the storage of the piece of program information in the memory controller includes selecting one of the inhibit information and the N portions of page data as the piece of program information to be stored in the memory controller, controlling the page buffer circuit to send the piece of program information to the memory controller for storage, and controlling the page buffer circuit to store a remaining portion of the inhibit information and the N portions of page data in the bit line storage unit and the N−1 data storage units, respectively.

In some implementations, controlling the page buffer circuit to release the sensing storage unit and the cache storage unit from being occupied by the suspension of the program operation through the storage of the piece of program information in the memory controller includes determining the piece of program information that is pre-stored in the memory controller, where the piece of program information includes one of the inhibit information and the N portions of page data, and controlling the page buffer circuit to store a remaining portion of the inhibit information and the N portions of page data in the bit line storage unit and the N−1 data storage units, respectively.

In some implementations, the piece of program information includes one of the N portions of page data. Controlling the page buffer circuit to store the remaining portion of the inhibit information and the N portions of page data in the bit line storage unit and the N−1 data storage units, respectively, includes controlling the page buffer circuit to store the inhibit information in the bit line storage unit, and controlling the page buffer circuit to store N−1 remaining portions of page data in the N−1 data storage units, respectively.

In some implementations, the piece of program information includes the inhibit information. Controlling the page buffer circuit to store the remaining portion of the inhibit information and the N portions of page data in the bit line storage unit and the N−1 data storage units, respectively, includes controlling the page buffer circuit to store the N portions of page data in the bit line storage unit and the N−1 data storage units, respectively.

In some implementations, responsive to the completion of the read operation, controlling the page buffer circuit to restore the suspended program information includes controlling the page buffer circuit to receive the piece of program information from the memory controller to recover the inhibit information and the N portions of page data in the page buffer circuit, and controlling the page buffer circuit to re-save the N portions of page data and the inhibit information in the N+1 storage units from the sensing storage unit, the bit line storage unit, the N−1 data storage units, and the cache storage unit, respectively.

In some implementations, initiating the read operation on the second memory cell includes controlling the page buffer circuit to store a read signal from the second memory cell in the sensing storage unit, controlling the page buffer circuit to send the read signal from the sensing storage unit to the cache storage unit, and controlling the page buffer circuit to send the read signal from the cache storage unit to an interface of the memory device.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
   an array of memory cells comprising a first memory cell and a second memory cell; and
   a peripheral circuit coupled to the array of memory cells and comprising:
   a page buffer comprising at least a page buffer circuit that is coupled to the first and second memory cells, respectively, the page buffer circuit comprising a sensing storage unit and a cache storage unit; and
   control logic coupled to the page buffer and configured to:
   suspend a program operation on the first memory cell responsive to receiving a suspension command indicative of executing a read operation on the second memory cell;
   control the page buffer circuit to store suspended program information associated with a suspension of the program operation;
   control the page buffer circuit to release the sensing storage unit and the cache storage unit from being occupied by the suspension of the program operation through a storage of a piece of program information from the suspended program information in a memory controller; and initiate the read operation on the second memory cell using the sensing storage unit and the cache storage unit.

2. The memory device of claim 1, wherein the control logic is further configured to:

responsive to a completion of the read operation, control the page buffer circuit to restore the suspended program operation based on the piece of program information received from the memory controller; and control the page buffer circuit to resume the program operation on the first memory cell using the suspended program information.

3. The memory device of claim 2, wherein:

the program operation is configured to write a piece of N-bits data at one of $2^N$ levels to the first memory cell, wherein the piece of N-bits data comprises N portions of page data, and N is an integer greater than 1; and the suspended program information comprises the N portions of page data and inhibit information associated with the program operation.

4. The memory device of claim 3, wherein:

the page buffer circuit further comprises a bit line storage unit and N–1 data storage units; and to control the page buffer circuit to store the suspended program information, the control logic is configured to:

control the page buffer circuit to store the N portions of page data and the inhibit information in N+1 storage units from the sensing storage unit, the bit line storage unit, the N–1 data storage units, and the cache storage unit, respectively.

5. The memory device of claim 4, wherein to control the page buffer circuit to release the sensing storage unit and the cache storage unit from being occupied by the suspension of the program operation through the storage of the piece of program information in the memory controller, the control logic is configured to:

select one of the inhibit information and the N portions of page data as the piece of program information to be stored in the memory controller;

control the page buffer circuit to send the piece of program information to the memory controller for storage; and control the page buffer circuit to store a remaining portion of the inhibit information and the N portions of page data in the bit line storage unit and the N–1 data storage units, respectively.

6. The memory device of claim 4, wherein to control the page buffer circuit to release the sensing storage unit and the cache storage unit from being occupied by the suspension of the program operation through the storage of the piece of program information in the memory controller, the control logic is configured to:

determine the piece of program information that is pre-stored in the memory controller, wherein the piece of program information comprises one of the inhibit information and the N portions of page data; and control the page buffer circuit to store a remaining portion of the inhibit information and the N portions of page data in the bit line storage unit and the N–1 data storage units, respectively.

7. The memory device of claim 5, wherein:

the piece of program information comprises one of the N portions of page data; and to control the page buffer circuit to store the remaining portion of the inhibit information and the N portions of page data in the bit line storage unit and the N–1 data storage units, respectively, the control logic is configured to:

control the page buffer circuit to store the inhibit information in the bit line storage unit; and control the page buffer circuit to store N–1 remaining portions of page data in the N–1 data storage units, respectively.

8. The memory device of claim 5, wherein:

the piece of program information comprises the inhibit information; and to control the page buffer circuit to store the remaining portion of the inhibit information and the N portions of page data in the bit line storage unit and the N–1 data storage units, respectively, the control logic is further configured to:

control the page buffer circuit to store the N portions of page data in the bit line storage unit and the N–1 data storage units, respectively.

9. The memory device of claim 4, wherein to control the page buffer circuit to restore the suspended program information responsive to the completion of the read operation, the control logic is configured to:

control the page buffer circuit to receive the piece of program information from the memory controller to recover the inhibit information and the N portions of page data in the page buffer circuit; and control the page buffer circuit to re-save the N portions of page data and the inhibit information in the N+1 storage units from the sensing storage unit, the bit line storage unit, the N–1 data storage units, and the cache storage unit, respectively.

10. The memory device of claim 1, wherein:

the sensing storage unit is coupled to the second memory cell;

the cache storage unit is coupled to the sensing storage unit and an interface of the memory device; and to initiate the read operation on the second memory cell, the control logic is configured to:

control the page buffer circuit to store a read signal from the second memory cell in the sensing storage unit;

control the page buffer circuit to send the read signal from the sensing storage unit to the cache storage unit; and control the page buffer circuit to send the read signal from the cache storage unit to the interface of the memory device.

11. The memory device of claim 1, wherein the first and second memory cells are in a three-dimensional (3D) NAND memory string.

12. A memory system, comprising:

a memory device configured to store data and comprising:

an array of memory cells comprising a first memory cell and a second memory cell; and a peripheral circuit coupled to the array of memory cells and comprising:

a page buffer comprising at least a page buffer circuit that is coupled to the first and second memory cells, respectively, the page buffer circuit comprising a sensing storage unit and a cache storage unit; and control logic coupled to the page buffer and configured to:

suspend a program operation on the first memory cell responsive to receiving a suspension command indicative of executing a read operation on the second memory cell;

control the page buffer circuit to store suspended program information associated with a suspension of the program operation; and control the page buffer circuit to release the sensing storage unit and the cache storage unit from being occupied by the suspension of the program operation for the read operation on the second memory cell; and a memory controller coupled to the memory device and configured to store a piece of program information from the suspended program information so that the sensing storage unit and the cache storage unit are released from being occupied by the suspension of the program operation.

13. The memory system of claim 12, wherein responsive to a completion of the read operation:

the memory controller is further configured to send the piece of program information to the page buffer circuit; and the control logic is further configured to:

control the page buffer circuit to restore the suspended program operation based on the piece of program information received from the memory controller; and control the page buffer circuit to resume the program operation on the first memory cell using the suspended program information.

14. The memory system of claim 13, wherein:

the program operation is configured to write a piece of N-bits data at one of $2^N$ levels to the first memory cell, wherein the piece of N-bits data comprises N portions of page data, and N is an integer greater than 1; and the suspended program information comprises the N portions of page data and inhibit information associated with the program operation.

15. The memory system of claim 14, wherein:

the page buffer circuit further comprises a bit line storage unit and N−1 data storage units; and to control the page buffer circuit to store the suspended program information, the control logic is configured to:

control the page buffer circuit to store the N portions of page data and the inhibit information in N+1 storage units from the sensing storage unit, the bit line storage unit, the N−1 data storage units, and the cache storage unit, respectively.

16. The memory system of claim 15, wherein to control the page buffer circuit to release the sensing storage unit and the cache storage unit from being occupied by the suspension of the program operation for the read operation on the second memory cell, the control logic is configured to:

control the page buffer circuit to release the sensing storage unit and the cache storage unit from being occupied by the suspension of the program operation through a storage of the piece of program information on the memory controller.

17. The memory device of claim 16, wherein the control logic is further configured to initiate the read operation on the second memory cell using the sensing storage unit and the cache storage unit.

18. The memory system of claim 16, wherein to control the page buffer circuit to release the sensing storage unit and the cache storage unit from being occupied by the suspension of the program operation through the storage of the piece of program information on the memory controller, the control logic is configured to:

select one of the inhibit information and the N portions of page data as the piece of program information to be stored in the memory controller;

control the page buffer circuit to send the piece of program information to the memory controller for storage; and control the page buffer circuit to store a remaining portion of the inhibit information and the N portions of page data in the bit line storage unit and the N−1 data storage units, respectively.

19. The memory system of claim 16, wherein the memory controller is configured to pre-store the piece of program information before the suspension of the program operation.

20. A method for operating a memory device comprising an array of memory cells, the array of memory cells comprising a first memory cell and a second memory cell that are coupled to a page buffer circuit in a page buffer, the page buffer circuit comprising a sensing storage unit and a cache storage unit, the method comprising:

suspending a program operation on the first memory cell responsive to receiving a suspension command indicative of executing a read operation on the second memory cell;

controlling the page buffer circuit to store suspended program information associated with a suspension of the program operation;

controlling the page buffer circuit to release the sensing storage unit and the cache storage unit from being occupied by the suspension of the program operation through a storage of a piece of program information from the suspended program information in a memory controller; and initiating the read operation on the second memory cell using the sensing storage unit and the cache storage unit.

* * * * *